(12) United States Patent
Xue et al.

(10) Patent No.: US 11,252,601 B2
(45) Date of Patent: Feb. 15, 2022

(54) RESOURCE ALLOCATION METHOD AND DEVICE

(71) Applicant: HUAWEI TECHNOLOGIES CO., LTD., Guangdong (CN)

(72) Inventors: Lixia Xue, Beijing (CN); Zheng Chen, Beijing (CN); Yan Cheng, Beijing (CN)

(73) Assignee: Huawei Technologies Co., Ltd., Guangdong (CN)

(*) Notice: Subject to any disclaimer, the term of this patent is extended or adjusted under 35 U.S.C. 154(b) by 242 days.

(21) Appl. No.: 16/705,808

(22) Filed: Dec. 6, 2019

(65) Prior Publication Data

US 2020/0112877 A1    Apr. 9, 2020

Related U.S. Application Data

(63) Continuation of application No. PCT/CN2018/100077, filed on Aug. 10, 2018.

(30) Foreign Application Priority Data

Aug. 11, 2017    (CN) .......................... 201710687804.7

(51) Int. Cl.
*H04W 28/02* (2009.01)
*H04W 72/04* (2009.01)
(Continued)

(52) U.S. Cl.
CPC ..... *H04W 28/0289* (2013.01); *H03M 13/271* (2013.01); *H04L 5/0007* (2013.01);
(Continued)

(58) Field of Classification Search
CPC .......... H04W 28/0289; H04W 72/042; H04W 72/0446; H04W 72/121; H04W 72/1268;
(Continued)

(56) References Cited

U.S. PATENT DOCUMENTS

2011/0085457 A1    4/2011    Chen et al.
2014/0119317 A1    5/2014    Kim et al.
(Continued)

FOREIGN PATENT DOCUMENTS

CN    101146317 A    3/2008
CN    101801093 A    8/2010
(Continued)

OTHER PUBLICATIONS

R1-1800795, Ericsson, 'On VRB-to-PRB mapping', 3GPP Tsg-Ran WG1 Ah 1801, Jan. 22-26, 2018, pp. 1-2. (Year: 2018).*
(Continued)

*Primary Examiner* — Melvin C Marcelo
(74) *Attorney, Agent, or Firm* — Fish & Richardson P.C.

(57) ABSTRACT

Example resource allocation methods and apparatus are described to resolve a problem of resource congestion and collision occurring in a communications system when virtual resource blocks (VRBs) scheduled for different terminal devices are mapped to physical resource blocks (PRBs). In one example method, system bandwidth of the communications system is divided into a plurality of fixed interleaving regions. Therefore, a network device can indicate a type of a virtual resource unit in a form of a frequency domain range occupied by one interleaving region. Using the foregoing solution can enable the network device to set the type of the virtual resource unit more conveniently.

20 Claims, 16 Drawing Sheets

(51) Int. Cl.
*H03M 13/27* (2006.01)
*H04W 72/12* (2009.01)
*H04L 5/00* (2006.01)

(52) U.S. Cl.
CPC ......... *H04L 5/0092* (2013.01); *H04W 72/042* (2013.01); *H04W 72/0446* (2013.01); *H04W 72/121* (2013.01); *H04W 72/1268* (2013.01); *H04W 72/1289* (2013.01)

(58) Field of Classification Search
CPC ............ H04W 72/1289; H03M 13/271; H04L 5/0007; H04L 5/0092
See application file for complete search history.

(56) References Cited

U.S. PATENT DOCUMENTS

| | | | |
|---|---|---|---|
| 2014/0204849 | A1 | 7/2014 | Chen et al. |
| 2015/0131546 | A1 | 5/2015 | Seo et al. |
| 2016/0073383 | A1 | 3/2016 | Han et al. |
| 2019/0394760 | A1* | 12/2019 | Hwang ............... H04W 72/042 |
| 2020/0244420 | A1* | 7/2020 | Wang ............... H04W 72/1263 |
| 2021/0083803 | A1* | 3/2021 | Sheng ............... H03M 13/2707 |

FOREIGN PATENT DOCUMENTS

| | | |
|---|---|---|
| CN | 103220103 A | 7/2013 |
| CN | 103636151 A | 3/2014 |
| CN | 104205672 A | 12/2014 |
| EP | 2077650 A2 | 7/2009 |

OTHER PUBLICATIONS

Huawei et al., "On uplink hopping and DVRB", 3GPP Draft, R1-1719829, XP051369552, Nov. 18, 2017, 5 pages.
Huawei, "On uplink data scheduling", 3GPP TSG RAN WG1 NR Ad-Hoc Meeting, R1-1710465, Qingdao, China, Jun. 27-30, 2017, 4 pages.
Nokia et al., "On resource allocation in frequency domain for PDSCH and PUSCH in NR", 3GPP Draft, R1-1710989, XP051300189, Jun. 26, 2017, 4 pages.
Office Action issued in Chinese Application No. 201710687804.7 dated May 26, 2020, 12 pages (With English Translation).
Extended European Search Report issued in European Application No. 18843956.6 dated Apr. 14, 2020, 9 pages.
PCT International Search Report and Written Opinion in International Application No. PCT/CN2018/100,077, dated Nov. 5, 2018, 11 pages (With English Translation).
Office Action issued in Chinese Application No. 201710687804.7 dated Dec. 4, 2020, 4 pages.

* cited by examiner

RESOURCE ALLOCATION METHOD AND DEVICE

CROSS-REFERENCE TO RELATED APPLICATIONS

This application is a continuation of International Application No. PCT/CN2018/100077, filed on Aug. 10, 2018, which claims priority to Chinese Patent Application No. 201710687804.7, filed on Aug. 11, 2017. The disclosures of the aforementioned applications are hereby incorporated by reference in their entireties.

TECHNICAL FIELD

This application relates to the field of communications technologies, and in particular, to a resource allocation method and a device.

BACKGROUND

In a communications system, before transmitting downlink data to a terminal device by using a physical downlink shared channel (PDSCH), a network device needs to send downlink control information (DCI) to the terminal device by using a physical downlink control channel (PDCCH), to notify the terminal device of a downlink frequency domain resource occupied by the PDSCH. The DCI includes a resource allocation information field used to indicate a position of a physical resource block (PRB) occupied by the PDSCH. The PRB occupied by the PDSCH is the downlink frequency domain resource occupied by the PDSCH.

Conventionally, there are three resource allocation types: a resource allocation type 0, a resource allocation type 1, and a resource allocation type 2. The base station may notify, by using a DCI format or a configuration of a related bit in the resource allocation information field in the DCI, the terminal device of a resource allocation type used for the downlink frequency domain resource occupied by the PDSCH.

A resource block (RB) is defined in an LTE communications system, and a virtual resource block (VRB) and a physical resource block (PRB) are defined, to implement resource allocation. The VRB is a logical concept of the RB, the PRB is a concept of the RB on a physical time-frequency resource, and the VPB is of a same size as the PRB in time domain and frequency domain. Therefore, in the communications system, when allocating the downlink frequency domain resource occupied by the PDSCH to the terminal device, the network device notifies the terminal device of a VRB number in a downlink scheduling information field. After determining the VRB number of the network device, the terminal device may determine, by using a mapping relationship between a VRB number and a PRB number, a number of a PRB that is scheduled by the network device for the terminal device, and the terminal device obtains a frequency domain position of the PRB of the PDSCH based on the number of the scheduled PRB. The PRB occupied by the PDSCH is the downlink frequency domain resource occupied by the PDSCH.

In addition, in the LTE, the downlink frequency domain resource occupied by the PDSCH is allocated in PRB pairs, and a PRB pair is defined as two PRBs of a same number $n_{PRB}$ in one subframe. A same VRB number $n_{VRB}$ is allocated to a VRB pair in two slots of one subframe. Two VRBs of one VRB pair may be respectively mapped to PRBs in corresponding slots (frequency domain positions of the two PRBs may be the same or different).

There are two types of VRBs in the current LTE communications system: a localized VRB and a distributed VRB, to map a VRB to a PRB.

For a localized VRB, the VRB is directly mapped to a PRB of a same number as the VRB. In other words, $n_{PRB}=n_{VRB}$. In addition, no frequency hopping occurs on two PRBs to which one VPB pair is mapped.

A process of mapping a distributed VRB to a PRB mainly includes the following two steps:

1. Interleaving: VRB pairs that are consecutively numbered are mapped, in an interleaving manner, to corresponding PRB pairs by using an interleaving matrix. In this case, two PRBs to which two VRBs in one VRB pair are mapped have a same number. In other words, frequency domain positions of the two PRBs are the same.

2. Frequency Hopping: Frequency hopping occurs on one of two PRBs to which each VPB is mapped, relative to another PRB at a specific frequency domain interval $N_{gap}$.

The resource allocation type 0 and the resource allocation type 1 support only the localized VRB. The resource allocation type 2 supports both the localized VRB and the distributed VRB.

In a fifth generation radio access system, namely, a new radio (NR) system, a BWP (Bandwidth part) is introduced. In the NR system, a network device allocates at least one BWP to each terminal device that accesses the network device. Before sending downlink information to a terminal device, the network device selects a target BWP from at least one BWP allocated to the terminal device, and selects, from the target bandwidth region, a downlink frequency domain resource occupied by a PDSCH. In other words, a VRB needs to be mapped to a PRB in the BWP in the NR system.

In a conventional communications system, a position of a PRB to which a VRB is mapped is determined based on a size of system bandwidth, and bandwidth of a downlink frequency domain resource used by a terminal device is the same as the system bandwidth. However, in the NR system, the network device allocates, to each terminal device, a BWP used by the terminal device, and bandwidth of the BWP allocated to each terminal device may be narrower than system bandwidth. Therefore, BWPs allocated by the network device to different terminal devices may overlap in frequency domain. If a concept of the VRB is introduced in the NR system, when a position of a PRB to which a VRB in a BWP is mapped is determined by a size and a position of a BWP of each terminal device, in a process of mapping the VRB to the PRB in the BWP, resource congestion and collision may occur on PRBs to which VRBs of different terminal devices are mapped. In other words, there are PRBs at a same frequency domain position in PRBs to which VRBs indicated by the network device to at least two terminal devices are mapped by the terminal devices.

SUMMARY

This application provides a resource allocation method and a device, to resolve a problem of resource congestion and collision that occur in a communications system when VRBs indicated to different terminal devices are mapped to PRBs.

According to a first aspect, an embodiment of this application provides a resource allocation method. The resource allocation method may be applied to a communications system in which a network device allocates a bandwidth region to each terminal device. The method includes the following steps.

First, a terminal device determines one or more bandwidth regions in system bandwidth that are used by the terminal device, where the terminal device receives or sends a data channel in the bandwidth region, the system bandwidth includes at least one interleaving region, each interleaving region includes at least one physical resource unit contiguous in frequency domain, each bandwidth region includes at least one first frequency domain region non-overlapping in frequency domain, each first frequency domain region completely overlaps at least one interleaving region in frequency domain, the at least one first frequency domain region is in a one-to-one correspondence with at least one first set, and each first set includes at least one virtual resource unit: and then the terminal device receives indication information sent by a network device, where the indication information is used to indicate a type of a virtual resource unit in the at least one first set. In this way, the terminal device can determine the type of the virtual resource unit in the at least one first set based on the indication information.

In the foregoing method, the system bandwidth of the communications system is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

In a possible design, the type of the virtual resource unit in the first set is a localized virtual resource unit or a distributed virtual resource unit.

With the foregoing design, the communications system can improve flexibility of mapping a virtual resource unit to a physical resource unit.

In a possible design, a quantity of virtual resource units in each first set is equal to a quantity of physical resource units in a first frequency domain region corresponding to the first set, and the virtual resource unit in each first set is mapped to a physical resource unit in the first frequency domain region corresponding to the first set.

With the foregoing design, the communications system can improve efficiency of mapping a virtual resource unit to a physical resource unit.

In a possible design, each bandwidth region further includes at least one second frequency domain region non-overlapping in frequency domain, each second frequency domain region partially overlaps at least one interleaving region in frequency domain, the at least one second frequency domain region is in a one-to-one correspondence with at least one second set, each second set includes at least one virtual resource unit, and a type of the virtual resource unit in the second set is a localized virtual resource unit.

With the foregoing design, the communications system can improve flexibility of allocating a bandwidth region to each terminal device.

In a possible design, a quantity of virtual resource units in each second set is equal to a quantity of physical resource units in a second frequency domain region corresponding to the second set, and the virtual resource unit in each second set is mapped to a physical resource unit in a frequency domain overlapping part between an interleaving region and the second frequency domain region corresponding to the second set.

With the foregoing design, the virtual resource unit in the second set may also be used for resource scheduling. In this way, resource utilization of the communications system can be increased.

In a possible design, the indication information is higher layer signaling and is used to indicate a type of the virtual resource unit in each first set.

With the foregoing design, flexibility of indicating, by the network device, the type of the virtual resource unit in the first set can be improved. In this way, when bandwidth regions used by a plurality of terminal devices overlap, the network device can control the type in each first set, to avoid resource congestion and collision that occur when physical resource units are scheduled for the plurality of terminal devices.

In a possible design, virtual resource units in all the first sets are of a same type, and the indication information is downlink control signaling and is used to indicate the type of the virtual resource units in all the first sets.

With the foregoing design, efficiency of indicating, by the network device, the type of the virtual resource unit in the first set can be improved.

In a possible design, the terminal device determines a number of each virtual resource unit in each first set and a number of each physical resource unit in a first frequency domain region corresponding to the first set, and/or determines a number of each virtual resource unit in each second set and a number of a physical resource unit in a second frequency domain region corresponding to the second set, where when a type of a virtual resource unit in a first set is a localized virtual resource unit, the virtual resource unit in the first set is mapped to a physical resource unit, of a same number as the virtual resource unit, in a first frequency domain region corresponding to the first set; or when a type of a virtual resource unit in a first set is a distributed virtual resource unit, a number of the virtual resource unit in the first set is mapped, by using an interleaving matrix, to a number of a physical resource unit in a frequency domain region corresponding to the first set: and a virtual resource unit in a second set is mapped to a physical resource unit, of a same number as the virtual resource unit, in a second frequency domain region corresponding to the second set.

With the foregoing design, the terminal device determines a position of a physical resource unit to which each virtual resource unit is mapped.

In a possible design, a quantity of rows of the interleaving matrix is a positive integer multiple of 6 or 8. In this way, when an RBG size in the communications system is set to an integer multiple of 2 or 3, or set to $2^n$, it can be ensured that resource allocation based on a distributed virtual resource unit and resource allocation based on a resource allocation type 0 can smoothly coexist in a same slot, a phenomenon of "single RB hole" in an RBG used for the resource allocation type 0 is reduced, resource fragments are reduced, and RBG utilization is increased.

In a possible design, in a first time region, a virtual resource unit numbered n1 in the first set is mapped to a physical resource unit numbered n2 in the first frequency domain region corresponding to the first set: and in a second time region, the virtual resource unit numbered n1 in the first set is mapped to a physical resource unit numbered n3 in the first frequency domain region corresponding to the first set, and the physical resource unit numbered n3 is obtained by cyclically shifting, in frequency domain, the physical resource unit numbered n2 by M physical resource units in the first frequency domain region.

With the foregoing design, frequency hopping may be implemented on two physical resource units, in two adjacent time regions, that are obtained after a distributed virtual resource unit is mapped in an interleaving manner, thereby increasing a frequency domain diversity gain of a data channel of the terminal device.

In a possible design, in the second time region, the number n3 may be determined by using the following formula: $(n2-K_0+M) \bmod N + K_0$, where $K_0$ is a number of the first virtual resource unit in the first set, and N is a quantity of virtual resource units in the first set.

In a possible design, the first time region and the second time region are in a same slot and do not overlap with each other.

In a possible design, for a bandwidth region, there are N virtual resource units in each first set and/or N physical resource units in each first frequency domain region, and N is preconfigured by the network device or configured by using higher layer signaling.

In a possible design, the terminal device receives higher layer signaling sent by the network device, where the higher layer signaling is used to indicate a frequency domain position, in each bandwidth region, of the at least one first frequency domain region and/or the at least one second frequency domain region in the bandwidth region.

With the foregoing design, the network device can notify, by using the higher layer signaling, the terminal device of the frequency domain position, in the bandwidth region used by the terminal device, of the at least one first frequency domain region and/or the at least one second frequency domain region.

According to a second aspect, an embodiment of this application provides a resource allocation method. The resource allocation method may be applied to a communications system in which a network device allocates a bandwidth region to each terminal device. The method includes the following steps.

First, a network device determines one or more bandwidth regions in system bandwidth that are used by a terminal device, and determines, in the bandwidth region, at least one frequency domain region non-overlapping in frequency domain, where the terminal device receives or sends a data channel in the bandwidth region, the system bandwidth includes at least one interleaving region, each interleaving region includes at least one physical resource unit contiguous in frequency domain, each first frequency domain region completely overlaps at least one interleaving region in frequency domain, the at least one first frequency domain region is in a one-to-one correspondence with at least one first set, and each first set includes at least one virtual resource unit; and then the network device sends indication information to the terminal device, where the indication information is used to indicate a type of a virtual resource unit in the at least one first set.

In the foregoing method, the system bandwidth of the communications system is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

In a possible design, the type of the virtual resource unit in the first set is a localized virtual resource unit or a distributed virtual resource unit.

With the foregoing design, the communications system can improve flexibility of mapping a virtual resource unit to a physical resource unit.

In a possible design, a quantity of virtual resource units in each first set is equal to a quantity of physical resource units in a first frequency domain region corresponding to the first set, and the virtual resource unit in each first set is mapped to a physical resource unit in the first frequency domain region corresponding to the first set.

With the foregoing design, the communications system can improve efficiency of mapping a virtual resource unit to a physical resource unit.

In a possible design, each bandwidth region further includes at least one second frequency domain region non-overlapping in frequency domain, each second frequency domain region partially overlaps at least one interleaving region in frequency domain, the at least one second frequency domain region is in a one-to-one correspondence with at least one second set, each second set includes at least one virtual resource unit, and a type of the virtual resource unit in the second set is a localized virtual resource unit.

With the foregoing design, the communications system can improve flexibility of allocating a bandwidth region to each terminal device.

In a possible design, a quantity of virtual resource units in each second set is equal to a quantity of physical resource units in a second frequency domain region corresponding to the second set, and the virtual resource unit in each second set is mapped to a physical resource unit in a frequency domain overlapping part between an interleaving region and the second frequency domain region corresponding to the second set.

With the foregoing design, the virtual resource unit in the second set may also be used for resource scheduling. In this way, resource utilization of the communications system can be increased.

In a possible design, the indication information is higher layer signaling and is used to indicate a type of the virtual resource unit in each first set.

With the foregoing design, flexibility of indicating, by the network device, the type of the virtual resource unit in the first set can be improved. In this way, when bandwidth regions used by a plurality of terminal devices overlap, the network device can control the type in each first set, to avoid resource congestion and collision that occur when physical resource units are scheduled for the plurality of terminal devices.

In a possible design, virtual resource units in all the first sets are of a same type, and the indication information is downlink control signaling and is used to indicate the type of the virtual resource units in all the first sets.

With the foregoing design, efficiency of indicating, by the network device, the type of the virtual resource unit in the first set can be improved.

In a possible design, the network device determines a number of each virtual resource unit in each first set and a number of each physical resource unit in a first frequency domain region corresponding to the first set, and/or determines a number of each virtual resource unit in each second set and a number of a physical resource unit in a second frequency domain region corresponding to the second set, where when a type of a virtual resource unit in a first set is a localized virtual resource unit, the virtual resource unit in the first set is mapped to a physical resource unit, of a same number as the virtual resource unit, in a first frequency domain region corresponding to the first set; or when a type of a virtual resource unit in a first set is a distributed virtual resource unit, a number of the virtual resource unit in the first set is mapped, by using an interleaving matrix, to a number of a physical resource unit in a frequency domain region corresponding to the first set; and a virtual resource unit in a second set is mapped to a physical resource unit, of a same number as the virtual resource unit, in a second frequency domain region corresponding to the second set.

With the foregoing design, the terminal device determines a position of a physical resource unit to which each virtual resource unit is mapped.

In a possible design, a quantity of rows of the interleaving matrix is a positive integer multiple of 6 or 8. In this way, when an RBG size in the communications system is set to an integer multiple of 2 or 3, or set to $2^n$, it can be ensured that resource allocation based on a distributed virtual resource unit and resource allocation based on a resource allocation type 0 can smoothly coexist in a same slot, a phenomenon of "single RB hole" in an RBG used for the resource allocation type 0 is reduced, resource fragments are reduced, and RBG utilization is increased.

In a possible design, in a first time region, a virtual resource unit numbered n1 in the first set is mapped to a physical resource unit numbered n2 in the first frequency domain region corresponding to the first set; and in a second time region, the virtual resource unit numbered n1 in the first set is mapped to a physical resource unit numbered n3 in the first frequency domain region corresponding to the first set, and the physical resource unit numbered n3 is obtained by cyclically shifting, in frequency domain, the physical resource unit numbered n2 by M physical resource units in the first frequency domain region.

With the foregoing design, frequency hopping may be implemented on two physical resource units, in two adjacent time regions, that are obtained after a distributed virtual resource unit is mapped in an interleaving manner, thereby increasing a frequency domain diversity gain of a data channel of the terminal device.

In a possible design, in the second time region, the number n3 may be determined by using the following formula: $(n2-K_0+M) \mod N + K_0$, where $K_0$ is a number of the first virtual resource unit in the first set, and N is a quantity of virtual resource units in the first set.

In a possible design, the first time region and the second time region are in a same slot and do not overlap with each other.

In a possible design, for a bandwidth region, there are N virtual resource units in each first set and/or N physical resource units in each first frequency domain region, and N is preconfigured by the network device or configured by using higher layer signaling.

In a possible design, the network device sends higher layer signaling to the terminal device, where the higher layer signaling is used to indicate a frequency domain position, in each bandwidth region, of the at least one first frequency domain region and/or the at least one second frequency domain region in the bandwidth region of the terminal device.

With the foregoing design, the network device can notify, by using the higher layer signaling, the terminal device of the frequency domain position of the at least one first frequency domain region and/or the at least one second frequency domain region in the bandwidth region used by the terminal device.

According to a third aspect, this application provides a resource allocation apparatus. The apparatus may be a terminal device, or may be a chip in a terminal device. The apparatus may include a processing unit and a transceiver unit. When the apparatus is a terminal device, the processing unit may be a processor, and the transceiver unit may be a transceiver. The terminal device may further include a storage unit, and the storage unit may be a memory. The storage unit is configured to store an instruction, and the processing unit executes the instruction stored by the storage unit, to enable the terminal device to perform the communication method in the first aspect. When the apparatus is a chip in a terminal device, the processing unit may be a processor, the transceiver unit may be an input/output interface, a pin, a circuit, or the like. The processing unit executes an instruction stored by a storage unit, to enable the terminal device to perform the communication method in the first aspect. The storage unit may be a storage unit (for example, a register or a cache) in the chip, or may be a storage unit (for example, a read-only memory or a random access memory), located outside the chip, in the terminal device.

According to a fourth aspect, this application provides a resource allocation apparatus. The apparatus may be a network device, or may be a chip in a network device. The apparatus may include a processing unit and a transceiver unit. When the apparatus is a network device, the processing unit may be a processor, and the transceiver unit may be a transceiver. The network device may further include a storage unit, and the storage unit may be a memory. The storage unit is configured to store an instruction, and the processing unit executes the instruction stored by the storage unit, to enable the network device to perform the communication method in the second aspect. When the apparatus is a chip in a network device, the processing unit may be a processor, the transceiver unit may be an input/output interface, a pin, a circuit, or the like. The processing unit executes an instruction stored by a storage unit, to enable the network device to perform the communication method in the second aspect. The storage unit may be a storage unit (for example, a register or a cache) in the chip, or may be a storage unit (for example, a read-only memory or a random access memory), located outside the chip, in the network device.

According to a fifth aspect, this application provides a computer program product. The computer program product includes computer program code. When the computer program code is run by a communications unit and a processing unit or a transceiver and a processor of a communications device (for example, a terminal device or a network device), the communications device is enabled to perform the communication method in the first aspect or the second aspect.

According to a sixth aspect, this application provides a computer readable storage medium. The computer readable storage medium stores a program. The program enables a communications device (for example, a terminal device or a network device) to perform the communication method in the first aspect or the second aspect.

According to a seventh aspect, an embodiment of this application provides a communications system. The communications system includes a terminal device and a network device.

In the solution provided in the embodiments of this application, the system bandwidth of the communications system is divided into a plurality of interleaving regions. Each interleaving region includes at least one physical resource unit contiguous in frequency domain. When allocating a resource to each terminal device, the network device first determines at least one frequency domain region in a bandwidth region used by the terminal device, where the at least one frequency domain region completely overlaps at least one interleaving region in frequency domain. Then, the network device may send, to the terminal device, information used to indicate a type of a virtual resource unit in at least one first set corresponding to the at least one frequency domain region. In the communications system, the system bandwidth is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

DESCRIPTION OF EMBODIMENTS

Figure 1:
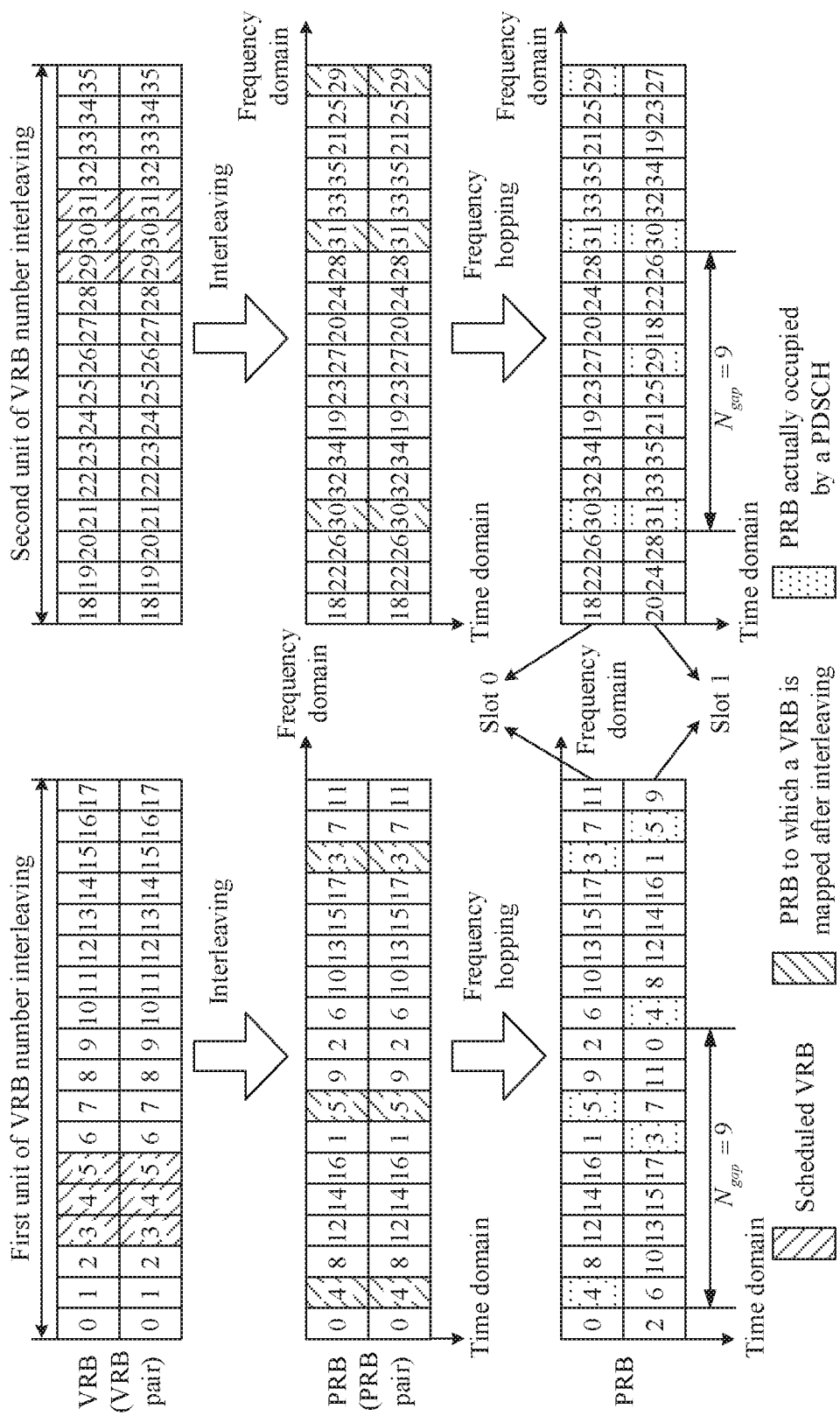
FIG. 1 is a schematic diagram of resource mapping according to an embodiment of this application.

This application provides a resource allocation method and a device, to resolve a problem of resource congestion and collision that occur in a communications system when VRBs indicated to different terminal devices are mapped to PRBs. The method and the device are based on a same inventive concept. Because principles, of the method and the device, for resolving the problem are similar, mutual reference may be made to implementation of the device and the method. Repeated content is not described again.

In a long term evolution (LTE) system, a VRB is defined. In this case, a network device may allocate, to a terminal device, a downlink frequency domain resource (to be specific, a PRB) occupied by a PDSCH, by indicating a number of an allocated VRB to the terminal device. A specific procedure includes:

The network device determines the number of the VRB allocated to the terminal device, and sends DCI to the terminal device, where the DCI carries information about the number of the VRB allocated to the terminal device and a type of the VRB. After receiving the DCI, the terminal device determines, by using the information about the number of the VRB and the type of the VRB that are carried in the DCI, the type of the VRB and the number of the VRB allocated by the network device to the terminal device, and obtains, through mapping from a VRB number to a PRB number, a PRB number corresponding to the determined number of the VRB, to determine a position of the PRB of the downlink frequency domain resource occupied by the PDSCH.

In the LTE system, the type of the VRB includes a localized VRB and a distributed VRB. A resource allocation type 0 and a resource allocation type 1 support only the localized VRB. A resource allocation type 2 supports both the localized VRB and the distributed VRB.

In a process of mapping a VRB to a PRB, the VRB is directly mapped to a PRB of a same number as the VRB. Therefore, details are not described again. The following describes in detail a process of mapping a distributed VRB to a PRB.

For the distributed VRB, the LTE system supports two manners of mapping from a VRB to a PRB:

1. mapping from a VRB to a PRB based on an entire system bandwidth (numbers of VRBs of the entire system bandwidth form one unit of VRB number interleaving); and 2. mapping from a VRB to a PRB based on a part of an entire system bandwidth (numbers of VRBs of the entire system bandwidth are divided into a plurality of units of VRB number interleaving).

In one system bandwidth, different mapping manners correspond to different frequency gaps $N_{gap}$ used during frequency hopping. $N_{gap}$ also varies with the system bandwidth. For details, refer to Table 1.

TABLE 1

Value of an RB gap (gap)

| System bandwidth ($N_{RB}^{DL}$) | 1st gap ($N_{gap,1}$) | 2nd gap ($N_{gap,2}$) |
|---|---|---|
| 6-10 | $\lceil N_{RB}^{DL}/2 \rceil$ | N/A |
| 11 | 4 | N/A |
| 12-19 | 8 | N/A |
| 20-26 | 12 | N/A |
| 27-44 | 18 | N/A |
| 45-49 | 27 | N/A |
| 50-63 | 27 | 9 |
| 64-79 | 32 | 16 |
| 80-116 | 48 | 16 |

$N_{RB}^{DL}$ represents a quantity of PRBs included in (downlink) system bandwidth. $N_{gap}$ is expressed in a quantity of RBs, and an RB may be understood as a PRB on a physical frequency domain resource.

For example, the system bandwidth of the LTE system meets $N_{RB}^{DL}=50$, a resource block group (RBG) size (size) meets P=3, and a manner of distributed mapping from a VRB to a PRB in the LTE system is the second manner. Therefore, $N_{gap}=N_{gap,2}=9$. A process of mapping the VRB to the PRB is as follows:

Step 1: Interleaving

1. Mapping a distributed VRB to a PRB is limited onto a bandwidth part of the entire system bandwidth. The bandwidth part has $\tilde{N}_{VRB}^{DL}$ VRBs that are consecutively numbered. In addition, numbers of the $\tilde{N}_{VRB}^{DL}$ VRBs form a unit of VRB number interleaving (Unit of VRB number interleaving), and each unit of VRB number interleaving corresponds to an interleaving matrix, where $\tilde{N}_{VRB}^{DL}$ meets formula 1:

$$\tilde{N}_{VRB}^{DL}=2N_{gap}=18 \quad \text{formula 1.}$$

2. A quantity of distributed VRBs in the system bandwidth may be less than a quantity of PRBs included in the system bandwidth. Therefore, the quantity $N_{VRB}^{DL}$ of VRBs in the system bandwidth $N_{RB}^{DL}$ meets formula 2:

$$N_{RB}^{DL}=N_{VRB,gap2}^{DL}=\lfloor N_{RB}^{DL}/2N_{gap} \rfloor \cdot 2N_{gap}=\lfloor N_{RB}^{DL}/\tilde{N}_{VRB}^{DL} \rfloor \cdot \tilde{N}_{VRB}^{DL}=36 \quad \text{formula 2.}$$

It can be learned from formula 1 and formula 2 that, $N_{VRB}^{DL}=36$ distributed VRBs in the system bandwidth need to be interleaved, and each unit of VRB number interleaving includes $\tilde{N}_{VRB}^{DL}=18$ VRBs. In other words, in each unit of VRB number interleaving, mapping from a distributed VRB to a PRB is limited to 18 PRBs, there are $N_{VRB}^{DL}/\tilde{N}_{VRB}^{DL}=2$ units of VRB number interleaving that correspond to two interleaving matrices. VRBs in the first unit of VRB number interleaving and VRBs in the second unit of VRB number interleaving are numbered from 0 to 17 and from 18 to 35, as shown in FIG. 1. In addition, PRBs to which the VRBs of the two units of VRB number interleaving are mapped are numbered from 0 to 17 and from 18 to 35 in ascending or descending order of frequencies.

3. Determine an interleaving matrix for each unit of VRB number interleaving. Each interleaving matrix has a total of four columns and $N_{row}$ rows.

A quantity of rows of the interleaving matrix represents a frequency domain interval between PRBs to which adjacent VRBs are mapped in an interleaving manner. The quantity of rows of the interleaving matrix meets $N_{row}=\lceil \tilde{N}_{VRB}^{DL}/(4P) \rceil \cdot P=6$, to reduce a quantity of RBGs occupied by scheduled PRBs, avoid "single-RB holes" in the RBGs, and increase utilization of RBG resources.

A quantity $4N_{row}$ of elements included in the interleaving matrix may be greater than $\tilde{N}_{VRB}^{DL}$. In this case, some elements in the interleaving matrix may be filled with null. Certainly, a quantity of elements filled with null meets $N_{null}=4N_{row}-\tilde{N}_{VRB}^{DL}=6$. In addition, elements filled with null are located in the second column and the fourth column and in the last $N_{null}/2=3$ rows.

4. Write, row by row, the numbers of the VRBs in each unit of VRB number interleaving into positions of non-null elements in the interleaving matrix. Therefore, it can be determined that an interleaving matrix corresponding to the first unit of VRB number interleaving is $$\begin{bmatrix} 0 & 1 & 2 & 3 \\ 4 & 5 & 6 & 7 \\ 8 & 9 & 10 & 11 \\ 12 & * & 13 & * \\ 14 & * & 15 & * \\ 16 & * & 17 & * \end{bmatrix},$$

and an interleaving matrix corresponding to the second unit of VRB number interleaving is $$\begin{bmatrix} 18 & 19 & 20 & 21 \\ 22 & 23 & 24 & 25 \\ 26 & 27 & 28 & 29 \\ 30 & * & 31 & * \\ 32 & * & 33 & * \\ 34 & * & 35 & * \end{bmatrix}.$$

* represents a null element.

5. In a process of mapping a VRB number to a PRB number, the interleaving matrix is read column by column, and reading is skipped when * is encountered. In this way, the PRB numbers to which the VRB numbers in each unit of VRB number interleaving are mapped after interleaving may be determined. As shown in FIG. 1, numbers of VRBs corresponding to PRBs numbered from 0 to 17 are respectively (0, 4, 8, 12, 14, 16, 1, 5, 9, 2, 6, 10, 13, 15, 17, 3, 7, 11).

It should be noted that, in a subframe, the network device indicates VRB information to the terminal device by using a number of a VRB pair, and two VRBs of one VRB pair respectively belong to two slots of the subframe, and have a same number. In the LTE system, a PRB is one slot in time domain, and one VRB pair may be mapped to two PRBs in two slots of a subframe.

Numbers of the two PRBs may be the same or different. When the numbers are the same, the two PRBs may be referred to as a PRB pair.

Step 2: Frequency Hopping

For two PRBs to which each VRB pair is mapped, a position of a PRB in an oddly-numbered slot is cyclically shifted, based on a position of a PRB in an evenly-numbered slot, by $\tilde{N}_{VRB}^{DL}/2=N_{gap}=9$ PRB positions within a bandwidth range including PRBs to which all VRBs in the unit of VRB number interleaving are mapped in an interleaving manner.

For example, in PRBs, to which a VRB pair numbered 4 is mapped after interleaving, shown in FIG. 1, a mapped-to PRB in a slot 0 is numbered 1, and a PRB in a slot 1 is shifted by nine PRB positions within the bandwidth range including the PRBs to which all the VRBs in the unit of VRB number interleaving are mapped in an interleaving manner, and is numbered 10.

According to the foregoing descriptions, in the LTE system, a distributed VRB may be mapped to a PRB by performing two steps: interleaving and frequency hopping.

In the LTE system, the terminal device may determine a mapping relationship between a VRB and a PRB. In this way, after determining a number of a VRB allocated by the network device to the terminal device, the terminal device can directly determine, based on the mapping relationship, a position of a PRB actually occupied by the PDSCH.

For example, when the terminal device determines that VRBs allocated by the network device to the terminal device are VRBs numbered 3, 4, and 5 in the first unit of VRB number interleaving, the terminal device may determine, based on the mapping relationship shown in FIG. 1, that PRBs at the second, eighth, and sixteenth frequency domain positions in the slot 0, and PRBs at the seventh, the eleventh, and the seventeenth frequency domain positions in the slot 1 are PRBs actually occupied by a PDSCH.

Figure 2:
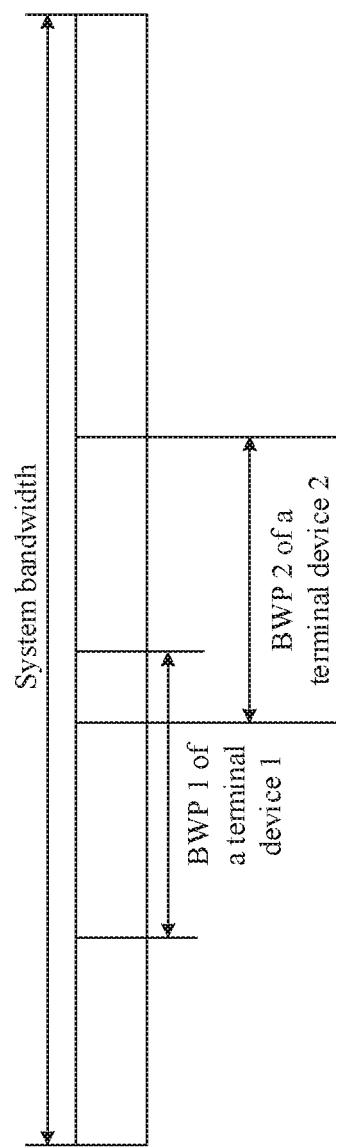
FIG. 2 is a schematic diagram of bandwidth region allocation according to an embodiment of this application.

It can be learned from the foregoing process of mapping a VRB to a PRB in the LTE system, a position of a PRB to which a VRB is mapped is determined based on a size of the system bandwidth, and bandwidth of a downlink frequency domain resource used by the terminal device is the same as the system bandwidth. However, in an NR system, a network device allocates, to each terminal device, a downlink frequency domain resource, for example, a BWP, for use by the terminal device. In addition, bandwidth of the BWP allocated to each terminal device may be narrower than system bandwidth. Therefore, BWPs allocated by the network device to different terminal devices may overlap in frequency domain, as shown in FIG. 2. In this case, in the NR system, if a position of a PRB to which a VRB is mapped is determined based on a size and position of the BWP of each terminal device, in the mapping process, positions of PRBs to which units of VRB number interleaving of different terminal devices are mapped may also overlap in frequency domain. If the foregoing mapping manner is still used, resource congestion and collision may occur when different terminal devices map VRBs to PRBs.

Figure 3:
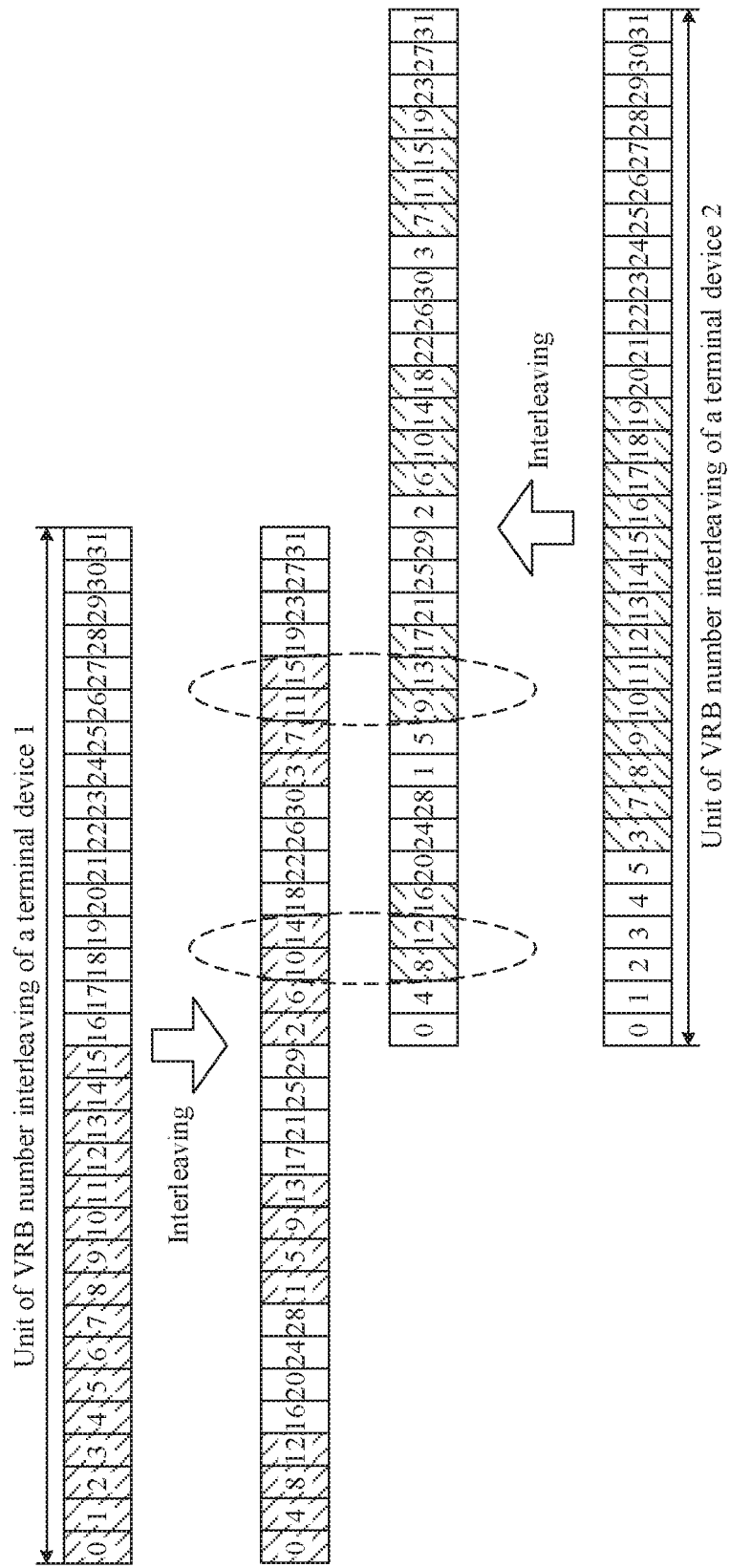
FIG. 3 is a schematic diagram of resource congestion and collision according to an embodiment of this application.

For example, in the NR system, downlink frequency domain resources allocated by the network devices to a terminal device 1 and a terminal device 2 are respectively a BWP 1 and a BWP 2, and bandwidths of the BWP 1 and the BWP 2 are both 100 PRBs. In this case, if the second manner of mapping from a distributed VRB to a PRB is used for the downlink frequency domain resource of each terminal device, an RBG size meets P=3, $N_{gap}=N_{gap,2}=16$, and there are 32 VRBs in a unit of VRB number interleaving of each terminal device. Because the BWP 1 of the terminal device 1 and the BWP 2 of the terminal device 2 overlap in frequency domain, a unit of VRB number interleaving of the terminal device 1 and a unit of VRB number interleaving of the terminal device 2 also overlap in frequency domain, as shown in FIG. 3. When VRBs scheduled by the network device for the terminal device 1 are numbered 1 to 15, and VRBs scheduled for the terminal device 2 are numbered 6 to 19, resource congestion and collision occur when the terminal device 1 and the terminal device map the VRBs to the PRBs. In other words, PRBs in ellipses in FIG. 3 are simultaneously occupied by PDSCHs of different terminal devices.

In the solution provided in the embodiments of this application, the system bandwidth of the communications system is divided into a plurality of interleaving regions. Each interleaving region includes at least one physical resource unit contiguous in frequency domain. When allocating a resource to each terminal device, the network device first determines at least one frequency domain region in a bandwidth region used by the terminal device, where the at least one frequency domain region completely overlaps at least one interleaving region in frequency domain. Then, the network device may send, to the terminal device, information used to indicate a type of a virtual resource unit in at least one first set corresponding to the at least one frequency domain region. In the communications system, the system bandwidth is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

In the following, some terms in this application are described, to help a person skilled in the art have a better understanding.

(1) A network device is a device that connects a terminal device to a wireless network in a communications system. The network device is a node in a radio access network, and may also be referred to as a base station or a radio access network (RAN) node (or device). Currently, some examples of network devices are a gNB, a transmission reception point (TRP), an evolved NodeB (eNB), a radio network controller (RNC), a NodeB (NB), a base station controller (BSC), a base transceiver station (BTS), a home base station (for example, a home evolved NodeB or a home NodeB, HNB), a baseband unit (BBU), and a wireless fidelity (Wi-Fi) access point (AP). In addition, in a network structure, the network device may include a centralized unit (CU) node and a distributed unit (DU) node. In this structure, a protocol layer of an eNB in a long term evolution (LTE) system is split, where some functions of the protocol layer are controlled by a CU in a centralized manner, some or all of remaining functions of the protocol layer are distributed in DUs, and the CU controls the DUs in a centralized manner.

(2) A terminal device is also referred to as user equipment (User Equipment, UE), a mobile station (MS), a mobile terminal (MT), or the like, and is a device that provides a user with voice and/or data connectivity, for example, a handheld device or a vehicle-mounted device with a wireless connection function. Currently, some examples of terminals are, for example, a mobile phone, a tablet computer, a notebook computer, a palmtop computer, a mobile Internet device (MID), a wearable device, a virtual reality (VR) device, an augmented reality (AR) device, a wireless terminal in industrial control, a wireless terminal in self-driving, a wireless terminal in remote medical surgery, a wireless terminal in a smart grid, a wireless terminal in transportation safety, a wireless terminal in a smart city, and a wireless terminal in a smart home.

(3) A resource unit is a frequency domain resource allocation granularity, for example, an RB. It should be noted that a scope of the resource unit in time domain is not limited in this application. The resource unit includes a physical resource unit and a virtual resource unit. The virtual resource unit is a logical concept of a frequency domain resource, and a size (in frequency domain and in time domain) of the virtual resource unit is the same as that of a physical resource unit to which the virtual resource unit is mapped. In a communications system, a network device may indicate, by using a mapping relationship between a virtual resource unit and a physical resource unit, information about a physical resource unit allocated to a terminal device.

In the embodiments of this application, the physical resource unit may be a PRB (physical resource block). The PRB is a PRB defined in an NR protocol, includes 12 contiguous subcarriers in frequency domain, and is numbered $n_{PRB}$. The virtual resource unit may be a VRB (virtual resource block), and is numbered $n_{VRB}$. The number of the virtual resource unit may be mapped to a number of another physical resource unit.

In the embodiments of this application, the physical resource unit may alternatively be a PRBG (physical resource block group). A PRBG may include a plurality of PRBs contiguous in frequency domain, and is numbered $n_{PRBG}$. The virtual resource unit may be a VRBG (virtual resource block group), and is numbered $n_{VRBG}$. The number of the virtual resource unit may be mapped to a number of another physical resource unit.

(4) A type of a virtual resource unit includes a localized virtual resource unit or a distributed virtual resource unit. The two different types of virtual resource units correspond to different manners of mapping from a virtual resource unit to a physical resource unit, for example, a manner of mapping from a number of a virtual resource unit to a number of a physical resource unit.

It can be learned from the foregoing descriptions of the resource unit that the resource unit is similar to an RB in a conventional sense. To improve flexibility of mapping from a virtual resource unit to a physical resource unit, the type of the virtual resource unit also includes the localized virtual resource unit or the distributed virtual resource unit.

For a localized virtual resource unit, the virtual resource unit is directly mapped to a physical resource unit of a same number as the virtual resource unit.

For a distributed virtual resource unit, a number of the virtual resource unit needs to be mapped to a number of a physical resource unit by using an interleaving matrix. For a specific process of performing mapping by using the interleaving matrix, refer to the procedure 4 and the procedure 5 in step 1 of the foregoing mapping process of the distributed VRB in the LTE. Details are not described again.

(5) A bandwidth region is a segment of frequency domain resource that is allocated by a network device to a terminal device in a communications system and that includes contiguous physical resource units (for example, PRBs). The bandwidth region used by the terminal device is within system bandwidth range of the communications system, and bandwidth of the bandwidth region used by the terminal device needs to be narrower than or equal to maximum bandwidth supported by the terminal device. The bandwidth region may be a downlink bandwidth region or an uplink bandwidth region. The terminal device receives or sends a data channel in the bandwidth region. The network device may allocate one or more downlink or uplink bandwidth regions to the terminal device. The terminal device may operate in one or more bandwidth regions (including a plurality of downlink bandwidth regions or a plurality of uplink bandwidth regions) at the same time. Numerologies (including a subcarrier spacing and a CP length) in all bandwidth regions may be the same or different.

Optionally, the bandwidth region may be a bandwidth part (BWP), but this is not limited in the embodiments of this application.

(6) The term "and/or" describes an association relationship for describing associated objects and represents that three relationships may exist. For example, A and/or B may represent the following three cases: Only A exists, both A and B exist, and only B exists. The character "/" generally indicates an "or" relationship between the associated objects.

It needs to be noted that a plurality of in this application refers to two or more.

In addition, it needs to be understood that, terms such as "first" and "second" in the descriptions of this application are used only for distinct description and cannot be understood as an indication or implication of relative significance or as an indication or implication of an order.

The following describes the embodiments of this application with reference to the accompanying drawings.

Figure 4:
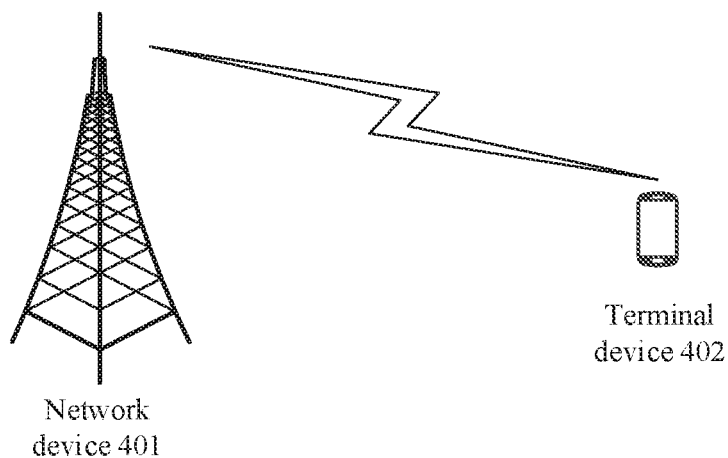
FIG. 4 is an architectural diagram of a communications system according to an embodiment of this application.

FIG. 4 shows an architecture of a possible communications system to which a resource allocation method provided in the embodiments of this application is applicable. Referring to FIG. 4, the communications system includes a network device 401 and a terminal device 402.

The network device 401 is responsible for providing a radio access-related service to the terminal device 402 to implement a radio physical layer function, and functions of resource scheduling and radio resource management, quality of service (QoS) management, radio access control, and mobility management.

The terminal device 402 is a device that accesses a network by using the network device 401.

The network device 401 and the terminal device 402 are connected over a Uu interface, to implement communication between the terminal device 402 and the network device 401.

When initially accessing the network device 401, each terminal device 402 reports a respective bandwidth capacity to the network device 401. To be specific, the terminal device 402 sends maximum bandwidth of the terminal device 402 to the network device 401. The maximum bandwidth of the terminal device 402 is a frequency domain width supported by the terminal device 402, and may be used as a specific representation of the bandwidth capacity of the terminal device 402. After receiving information about the maximum bandwidth, the network device 401 allocates one or more bandwidth regions to the terminal device 402 based on the maximum bandwidth and the system bandwidth. After the terminal device accesses the network device 401, the network device 401 determines, in the plurality of bandwidth regions, a bandwidth region used by the terminal device, as a downlink frequency domain resource or an uplink frequency domain resource of the terminal device 402. The terminal device may receive or send a data channel (for example, a PDSCH or a PUSCH) in the bandwidth region. Subsequently, when needing to send a data channel to the terminal device 402 or receive a data channel from the terminal device 402, the network device 401 may allocate, to the terminal device, a downlink frequency domain resource or an uplink frequency domain resource occupied by the data channel in the bandwidth region.

It needs to be noted that the system shown in FIG. 4 is only an example of the communications system provided in the embodiments of this application. The embodiments of this application may be alternatively applied to the 5th generation (5G) mobile communications system (for example, an NR system), a long term evolution (LTE) system, another mobile communications system, and another mobile communications system evolved based on the foregoing mobile communications systems. This is not limited in the embodiments of this application.

Figure 5:
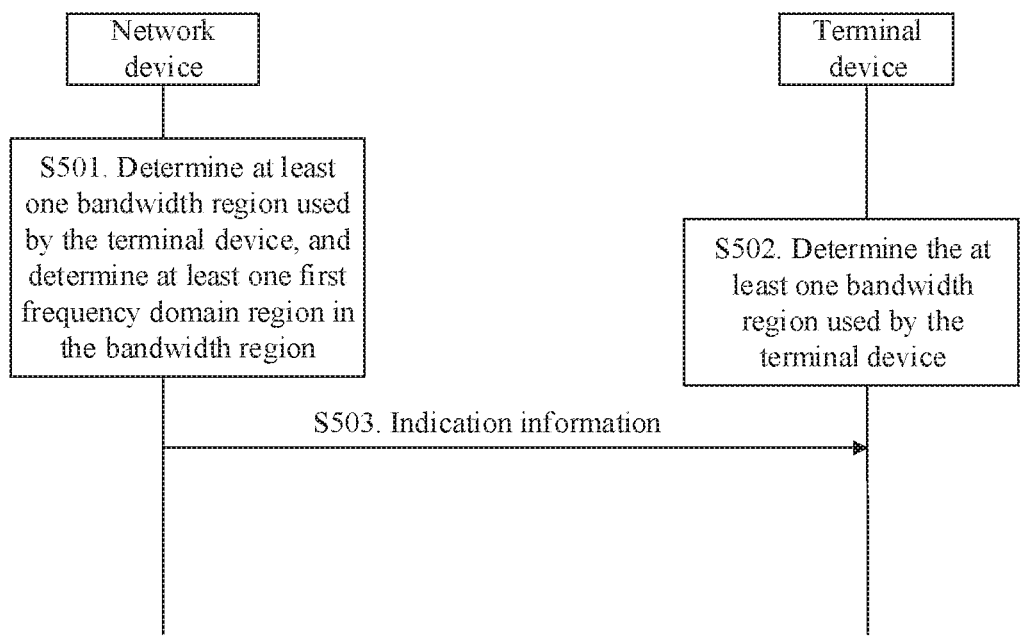
FIG. 5 is a flowchart of resource allocation according to an embodiment of this application.

An embodiment of this application provides a resource allocation method. The method may be applied to, but not limited to, the communications system shown in FIG. 4. The communications system includes a network device and a terminal device. Referring to in FIG. 5, a procedure of the method includes the following steps.

S501: The network device determines at least one bandwidth region used by the terminal device in system bandwidth, and determines, in the bandwidth region, at least one first frequency domain region non-overlapping in frequency domain.

The terminal device receives or sends a data channel (for example, a PDSCH or a PUSCH) in the bandwidth region. In other words, the bandwidth region is a downlink uplink bandwidth resource or an uplink bandwidth resource used by the terminal device.

In the communications system, the system bandwidth includes a plurality of interleaving regions, and each interleaving region includes at least one physical resource unit contiguous in frequency domain.

Figure 6:
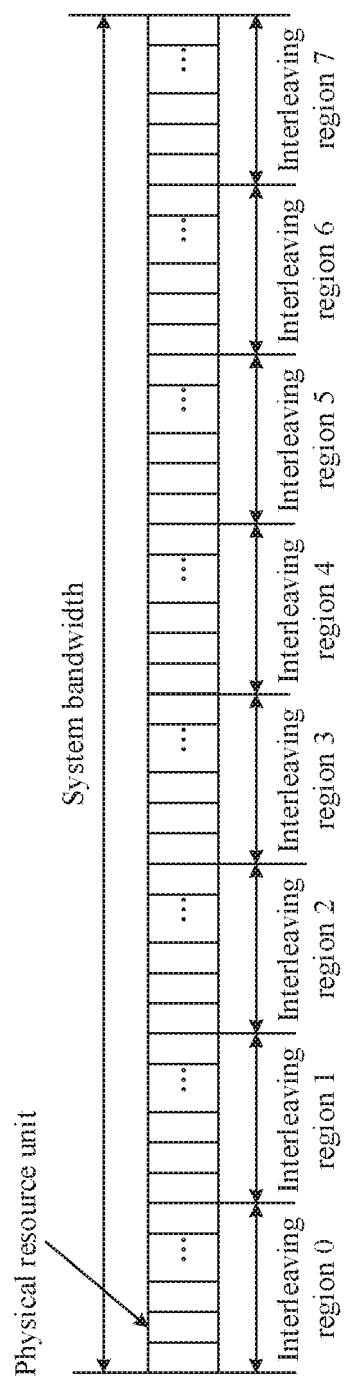
FIG. 6 is an example of a distribution diagram of interleaving regions included in system bandwidth according to an embodiment of this application.

Optionally, the system bandwidth includes at least one interleaving region of an equal size that does not overlap with each other and that is contiguously distributed in frequency domain, and each interleaving region includes an equal quantity of physical resource units with contiguous frequency domain positions. For example, system bandwidth shown in FIG. 6 is evenly divided into eight interleaving regions of an equal size that do not overlap with each other and that are contiguously distributed in frequency domain.

Figure 7:
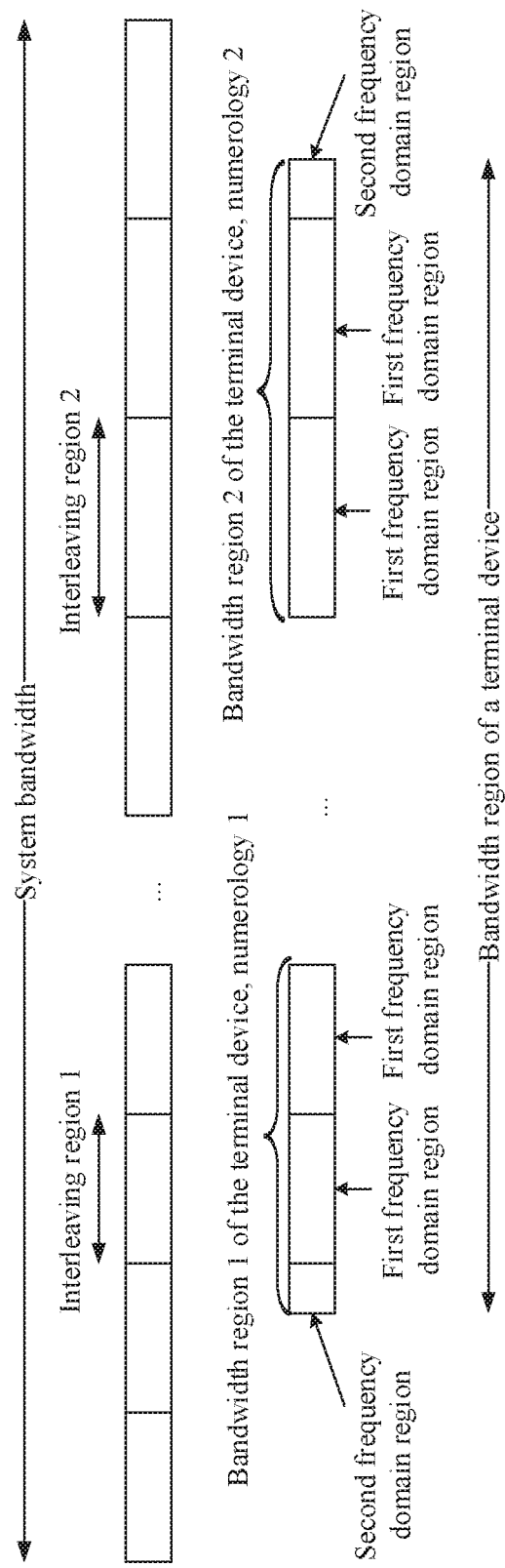
FIG. 7 is an example of a distribution diagram of system bandwidth and bandwidth regions according to an embodiment of this application.

Optionally, bandwidth of all interleaving regions included in the system bandwidth may be different, and physical resource units included in all interleaving regions may also be different. For example, as shown in FIG. 7, frequency domain regions of different numerologies exist in the system bandwidth, and bandwidth of an interleaving region 1 and bandwidth of an interleaving region 2 that are located in the frequency domain regions of the different numerologies may be different, and quantities of physical resource units included in the interleaving region 1 and the interleaving region 2 may be different.

Each first frequency domain region completely overlaps at least one interleaving region in frequency domain. Optionally, in the at least one first frequency domain region, quantities of interleaving regions overlapping different first frequency domain regions may be the same or different. This is not limited in this embodiment of this application.

Optionally, bandwidths of first frequency domain regions in different bandwidth regions of one terminal device and quantities of physical resource units included in the first frequency domain regions may be different, but first frequency domain regions in one bandwidth region have same bandwidth. For example, as shown in FIG. 7, frequency domain regions of different numerologies exist in the system bandwidth, and bandwidth of first frequency domain regions in different bandwidth regions of one terminal device that are located in frequency domain regions of different numerologies may be different, and quantities of physical resource units included in the first frequency domain regions may be different.

Optionally, each first frequency domain region in the bandwidth region completely overlaps one interleaving region in the bandwidth region in frequency domain. In other words, one first frequency domain region is in a one-to-one correspondence with one interleaving region, the first frequency domain region and the interleaving region have same bandwidth, and are completely consistent in frequency domain position. Different first frequency domain regions do not overlap with each other in frequency domain and are contiguously distributed in frequency domain.

Figure 8:
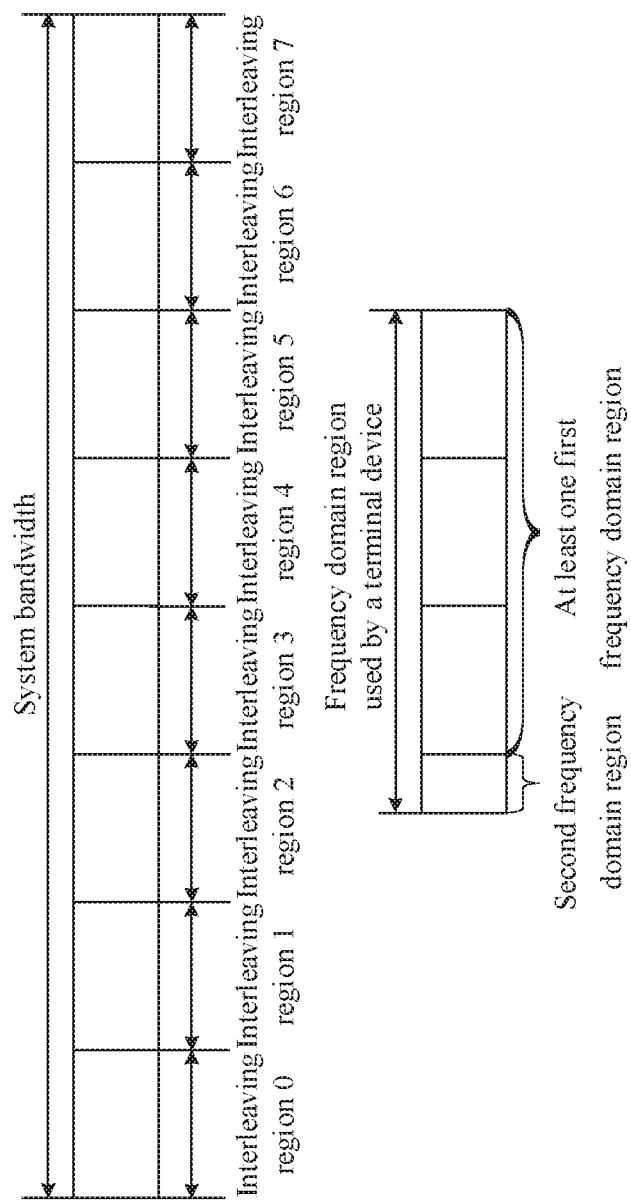
FIG. 8 is an example of a distribution diagram of system bandwidth and first frequency domain regions according to an embodiment of this application.

For example, as shown in FIG. 8, system bandwidth is still divided into eight interleaving regions, and a frequency domain region used by the terminal device completely overlaps an interleaving region 3, an interleaving region 4, and an interleaving region 5.

Distribution of first frequency domain regions in this scenario may include the following several cases:

Case 1: There may be three first frequency domain regions, and each first frequency domain region completely overlaps one interleaving region.

Case 2: There may be two first frequency domain regions. One first frequency domain region completely overlaps the interleaving region 3 and the interleaving region 4, and the other first frequency domain region completely overlaps the interleaving region 5. Alternatively, one first frequency domain region completely overlaps the interleaving region 4 and the interleaving region 5, and the other first frequency domain region completely overlaps the interleaving region 3.

Case 3: There may be one first frequency domain region, and the first frequency domain region completely overlaps the interleaving region 3, the interleaving region 4, and the interleaving region 5.

Figure 8A:
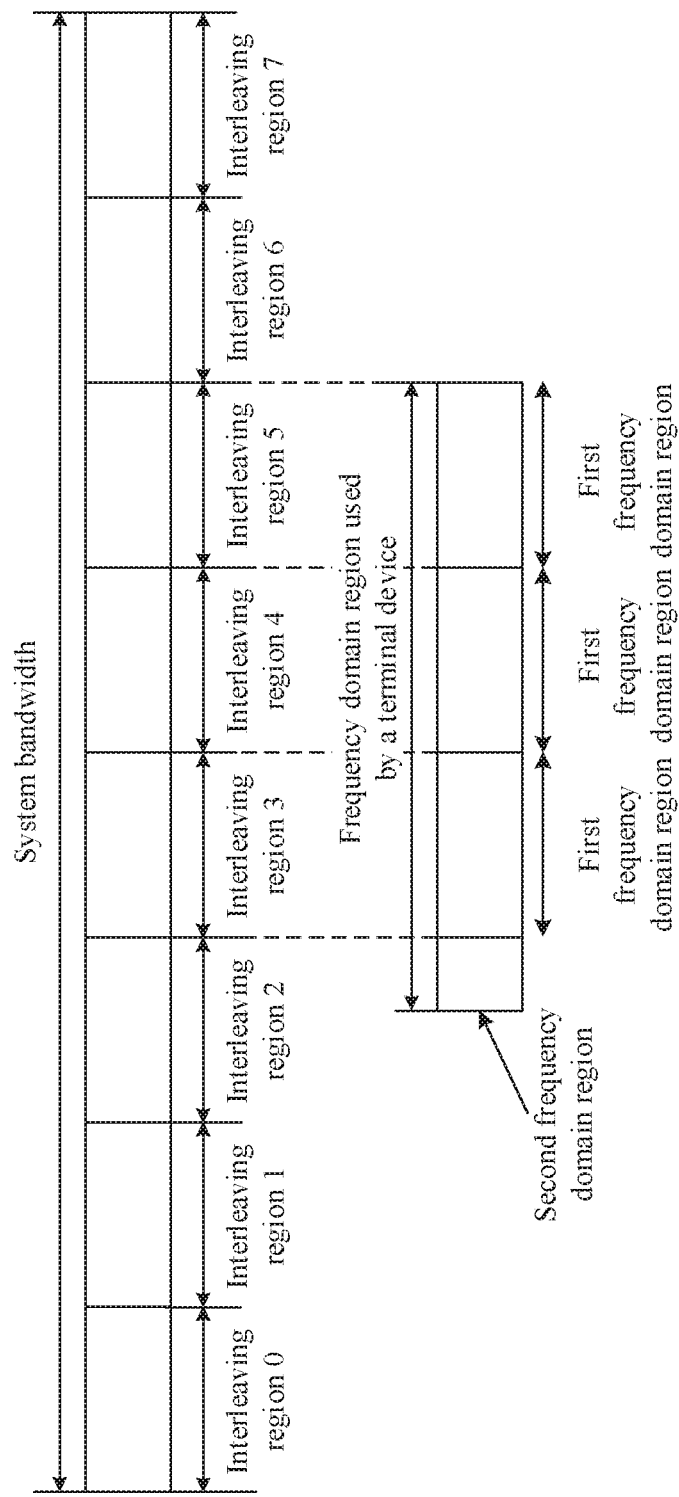
FIG. 8A is an example of a distribution diagram of system bandwidth and first frequency domain regions according to an embodiment of this application.

Optionally, all first frequency domain regions in the bandwidth region have same bandwidth, and the first frequency domain regions do not overlap with each other in frequency domain. Different first frequency domain regions are contiguous in frequency domain, and all the first frequency domain regions include an equal quantity of physical resource units. A quantity of first frequency domain regions in the bandwidth region is equal to that of interleaving regions that are totally located in the bandwidth region in frequency domain, and the first frequency domain regions are in a one-to-one correspondence with the interleaving regions, as shown in FIG. 8A.

The at least one first frequency domain region is in a one-to-one correspondence with at least one first set, and each first set includes at least one virtual resource unit.

Optionally, the first set may be a unit of virtual resource unit number interleaving, and numbers of these virtual resource units are consecutive. In other words, each element in the first set is a number of a virtual resource unit.

Optionally, when virtual resource units in the first set are consecutively numbered from N1 to N2, physical resource units in a first frequency domain region corresponding to the first set are consecutively numbered from N1 to N2.

Preferably, the first set may be a unit of VRB/VRBG number interleaving (Unit of VRBNRBG number interleaving), and numbers of these VRBs/VRBGs are consecutive. In other words, each element in the first set is a number of a VRB/VRBG Optionally, a quantity of virtual resource units in each first set is equal to a quantity of physical resource units in a first frequency domain region corresponding to the first set, and the virtual resource unit in each first set is mapped to a physical resource unit in the first frequency domain region corresponding to the first set.

Optionally, the bandwidth region may further include at least one second frequency domain region non-overlapping in frequency domain, each second frequency domain region partially overlaps at least one interleaving region in frequency domain, the at least one second frequency domain region is in a one-to-one correspondence with at least one second set, and each second set includes at least one virtual resource unit.

Optionally, the second set may be a unit of virtual resource unit number interleaving, and numbers of these virtual resource units are consecutive. In other words, each element in the second set is a number of a virtual resource unit.

Preferably, the second set may be a unit of VRB/VRBG number interleaving (Unit of VRB/VRBG number interleaving), and numbers of these VRBs/RBGs are consecutive. In other words, each element in the second set is a number of a VRB/VRBG.

Optionally, when virtual resource units in the second set are consecutively numbered from N1 to N2, physical resource units in a second frequency domain region corresponding to the second set are consecutively numbered from N1 to N2.

The at least one second frequency domain region is located at two ends of the bandwidth region in frequency domain. Each second frequency domain region partially overlaps one interleaving region in frequency domain. In other words, bandwidth of the second frequency domain region is narrower than bandwidth of the interleaving region, and the bandwidth of the second frequency domain region is completely located in the interleaving region. For example, the second frequency domain region is shown in FIG. 8 or FIG. 8A.

From the foregoing descriptions of the distributed VRB and the distributed virtual resource unit, it can be learned that, in a process of mapping a distributed virtual resource unit to a physical resource unit, a step of interleaving needs to be performed, and the step is implemented in a complete interleaving region. Therefore, physical resource units obtained by interleaving some virtual resource units in the second set may go beyond the second frequency domain region.

Figure 9:
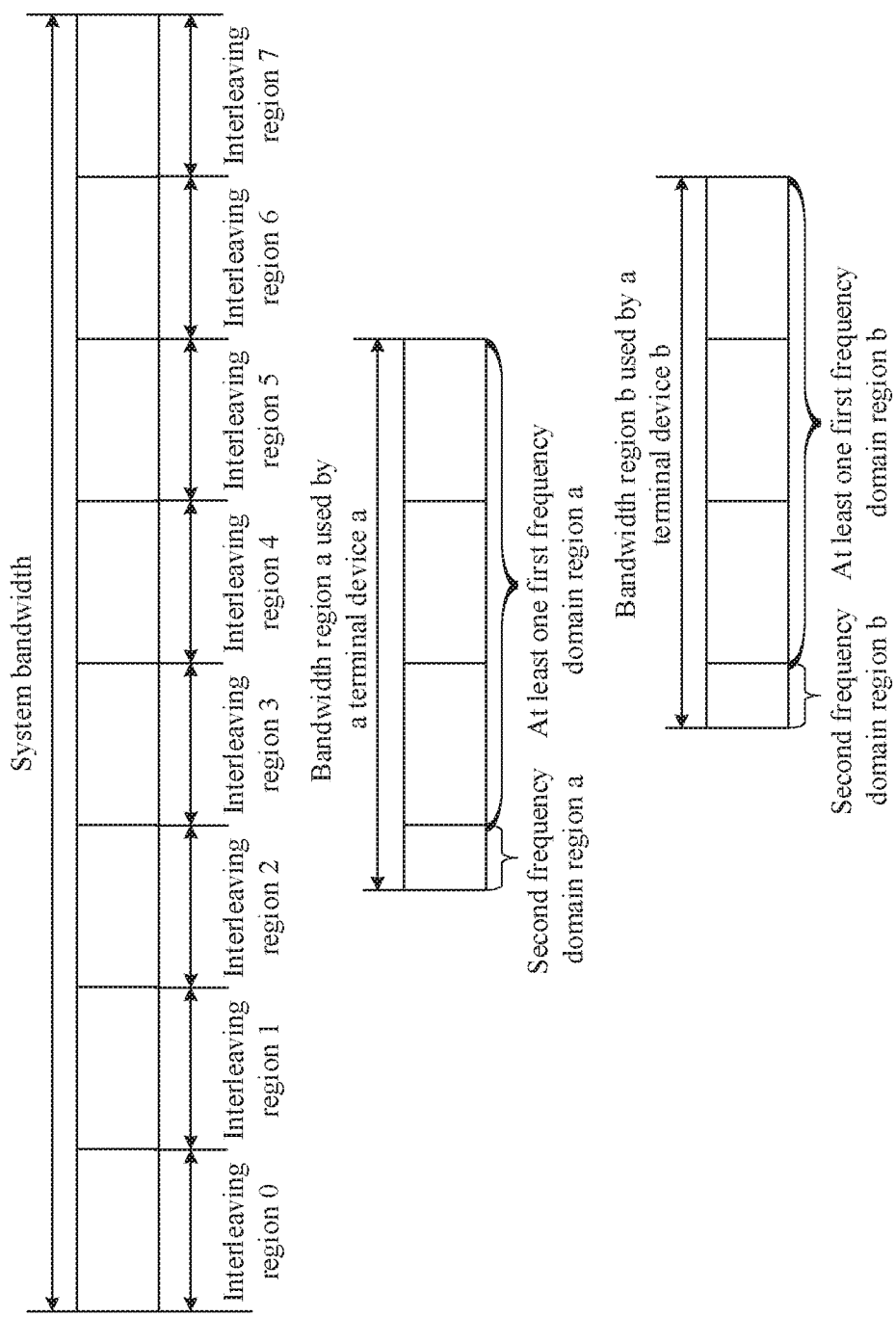
FIG. 9 is an example of a distribution diagram of system bandwidth and a plurality of frequency domain regions according to an embodiment of this application.

For example, as shown in FIG. 9, an interleaving region includes 32 physical resource units. A second frequency domain region exists in a bandwidth region used by the terminal device, partially overlaps the interleaving region, and includes 16 physical resource units. If a type of a virtual resource unit in a second set corresponding to the second frequency domain region is a distributed resource unit, physical resource units to which some virtual resource units in the second set are mapped after being interleaved, for example, physical resource units circled by the ellipses in the figure, go beyond the second frequency domain region.

Therefore, to avoid the foregoing case, the type of the virtual resource unit in the second set is a centralized virtual resource unit.

Optionally, a quantity of virtual resource units in each second set is equal to a quantity of physical resource units in a second frequency domain region corresponding to the second set, and the virtual resource unit in each second set is mapped to a physical resource unit in a frequency domain overlapping part between an interleaving region and the second frequency domain region corresponding to the second set.

S502: The terminal device determines the at least one bandwidth region used by the terminal device in the system bandwidth.

Optionally, the terminal device may determine bandwidth and a frequency domain position of the bandwidth region of the terminal device by using higher layer signaling sent by the network device. There are K physical resource units in one bandwidth region, and the physical resource units are consecutively numbered from k0 (for example, k0 may be 0) in ascending or descending order in frequency domain, and are numbered from k0 to k0+K−1; virtual resource units are numbered from k0 to k0+K−1; and there are N (a value of N may be configured by the network device or by using higher layer signaling) physical resource units in the first frequency domain region, and the bandwidth region includes a total of L interleaving regions that are completely located in the bandwidth region in frequency domain. In this case, the L interleaving regions correspond to L first frequency domain regions. Virtual resource units in a second set corresponding to the $1^{st}$ second frequency domain region and physical resource units in the $1^{st}$ second frequency domain region are numbered from k0 to k0+n, and virtual resource units in a first set corresponding to the $1^{st}$ first frequency domain region and physical resource units in the $1^{st}$ first frequency domain region are numbered from k0+n+1 to k0+n+N, and so on. In this case, virtual resource units in a first set corresponding to the $L^{th}$ first frequency domain region and physical resource units in the $L^{th}$ first frequency domain region are numbered from k0+n+(L−1)×N+1 to k0+n+L×N, and virtual resource units in a second set corresponding to the $2^{nd}$ second frequency domain region and physical resource units in the $2^{nd}$ second frequency domain region are numbered from k0+n+L N+1 to k0+K.

If the terminal device cannot determine a size and a frequency domain position of the system bandwidth, the terminal device may receive higher layer signaling from the network device. The higher layer signaling may be used to indicate the start number k0+n+1 of the virtual resource units in the first set corresponding to the $1^{st}$ first frequency domain region and the start number k0+n+1 of the physical resource units. In this case, the terminal device may determine numbers of virtual resource units in all first sets and all second sets, and numbers of physical resource units in all first frequency domain regions and all second frequency domain regions. The higher layer signaling may be alternatively used to indicate a start position of the $1^{st}$ first frequency domain region in the bandwidth region, so that the terminal device determines the numbers.

By using the foregoing method, the terminal device can determine a quantity of all the first frequency domain regions and a quantity of all the second frequency domain regions, frequency domain positions, in the bandwidth region, of all the first frequency domain regions and all the second frequency domain regions, the numbers of the corresponding physical resource units, and the numbers of the virtual units in all the first sets and all the second sets.

Optionally, the terminal device may determine, by using control signaling such as DCI sent by the network device, the bandwidth region used by the terminal device.

In addition, the terminal device may further determine, based on the higher layer signaling sent by the network device, a frequency domain position, in each bandwidth region, of the at least one first frequency domain region and/or the at least one second frequency domain region in the bandwidth region. For example, the higher layer signaling may include information used to indicate a start position, in the bandwidth region, of the at least one first frequency domain region and/or the at least one second frequency domain region.

S503: The network device sends indication information to the terminal device. Correspondingly, the terminal device receives the indication information sent by the network device. The indication information is used to indicate a type of a virtual resource unit in the at least one first set.

After S503, the terminal device may determine the type of the virtual resource unit in the at least one first set based on the received indication information.

Optionally, the indication information is higher layer signaling and is used to indicate a type of the virtual resource unit in each first set. Optionally, the higher layer signaling may be a bitmap. The bitmap may include a plurality of bits, and each bit represents a type of a virtual resource unit in one first set. The type of the virtual resource unit in each first set is indicated by using the bitmap. This is not limited in this application. Optionally, the higher layer signaling may be radio resource control (RRC) signaling.

Optionally, the indication signaling may alternatively be dynamic signaling and is used to indicate a type of the virtual resource units in all the first sets. Optionally, the dynamic signaling may be downlink control information, and the downlink control information is terminal-device-specific downlink control information. The network device may configure the type of the virtual resource units in all the first sets by using a value of a type information field of a virtual resource unit in the downlink control information. For example, the information field is 1-bit. When the value of the type indication field is "1", it indicates that the type of the virtual resource units in all the first sets is a localized virtual resource unit: and when the value of the type indication is "0", it indicates that the type of the virtual resource units in all the first sets is a distributed virtual resource unit. Alternatively, when the value of the type indication field is "0", it indicates that the type of the virtual resource units in all the first sets is a localized virtual resource unit; and when the value of the type indication is "1", it indicates that the type of the virtual resource units in all the first sets is a distributed virtual resource unit.

From the foregoing descriptions of the second frequency domain resource, it can be learned that a type of the virtual resource unit in the second set corresponding to the second frequency domain resource may be configured (configured by default) only as the localized virtual resource unit.

Optionally, in this embodiment of this application, the method further includes the following content:

The terminal device or the network device may determine a number of each virtual resource unit in each first set and a number of each physical resource unit in a first frequency domain region corresponding to the first set, and/or may determine a number of each virtual resource unit in each second set and a number of a physical resource unit in a second frequency domain region corresponding to the second set.

Similar to the process of mapping a localized VRB to a PRB, in the method, when a type of a virtual resource unit in a first set is a localized virtual resource unit, the virtual resource unit in the first set is mapped to a physical resource unit, of a same number as the virtual resource unit, in a first frequency domain region corresponding to the first set.

Similar to the process of mapping a distributed VRB to a PRB, in the method, when a type of a virtual resource unit in a first set is a distributed virtual resource unit, a number of the virtual resource unit in the first set is mapped, by using an interleaving matrix, to a number of a physical resource unit in a frequency domain region corresponding to the first set.

Similar to the process of mapping a localized VRB to a PRB, in the method, a virtual resource unit in a second set is mapped to a physical resource unit, of a same number as the virtual resource unit, in a second frequency domain region corresponding to the second set.

A setting principle of the interleaving matrix is the same as that of an interleaving matrix in the LTE system. There are still four columns in the interleaving matrix, and a quantity of elements in the interleaving matrix (a quantity of virtual resource units in the first set) is usually a multiple of 4. There are N physical resource units in the interleaving region is N. A value of N may be 24, 32, 48, or the like, or may be a positive integer multiple of the foregoing value, and may be specifically preconfigured by the network device or configured by using the higher layer signaling. In addition, the base station may configure, by using the higher layer signaling or through pre-configuration, the value of N for each bandwidth region of the terminal device. Values of N configured for different bandwidth regions may be the same or different.

In addition, when a BL/CE terminal device is not considered, a quantity of virtual resource units in a unit of interleaving shall not be greater than a quantity of physical resource units included in a minimum bandwidth of the terminal device, to ensure access performance of the terminal device. Usually, 24 physical resource units are included in the minimum bandwidth of the terminal device. Therefore, there may be 24 physical resource units in the interleaving region. This is not limited in this application.

Optionally, a quantity of rows of the interleaving matrix may be set to an integer multiple of an RBG size, to ensure that resource allocation based on a distributed virtual resource unit and resource allocation based on a resource allocation type 0 can smoothly coexist in a same slot, reduce a phenomenon of "single RB hole" in an RBG used for the resource allocation type 0, reduce resource fragments, and improve RBG utilization.

Therefore, in the communications system, when the RBG size may be an integer multiple of 2 or 3, the quantity of rows of the interleaving matrix may be set to an integer multiple of 6. When the RBG size may be set to $2^n$ (for example, 2, 4, or 8), the quantity of rows of the interleaving matrix may be set to an integer multiple of 8 or 16. In conclusion, the quantity of rows of the interleaving matrix is a positive integer multiple of 6 or 8.

For example, when virtual resources in the first set are numbered from 0 to 23, and there are 24 elements in the interleaving matrix, the interleaving matrix may be:

$$\begin{bmatrix} 0 & 1 & 2 & 3 \\ 4 & 5 & 6 & 7 \\ 8 & 9 & 10 & 11 \\ 12 & 13 & 14 & 15 \\ 16 & 17 & 18 & 19 \\ 20 & 21 & 22 & 23 \end{bmatrix} \text{ or } \begin{bmatrix} 0 & 1 & 2 & 3 \\ 4 & 5 & 6 & 7 \\ 8 & 9 & 10 & 11 \\ 12 & 13 & 14 & 15 \\ 16 & * & 17 & * \\ 18 & * & 19 & * \\ 20 & * & 21 & * \\ 22 & * & 23 & * \end{bmatrix}.$$

in the matrix represents a null element.

It should be noted that the interleaving matrix in this embodiment of this application does not depend on the resource allocation solution provided in this embodiment of this application. The interleaving matrix may be alternatively applicable to mapping from a virtual resource unit to a physical resource unit in another communications system. This is not limited in this application.

Optionally, from the foregoing descriptions of the distributed virtual resource unit, it can be learned that, when the type of the virtual resource unit in the first set is the distributed virtual resource unit, in two time regions:

in a first time region, a virtual resource unit numbered n1 in the first set is mapped to a physical resource unit numbered n2 in the first frequency domain region corresponding to the first set; and in a second time region, the virtual resource unit numbered n1 in the first set is mapped to a physical resource unit numbered n3 in the first frequency domain region corresponding to the first set, and the physical resource unit numbered n3 is obtained by cyclically shifting, in frequency domain, the physical resource unit numbered n2 by M physical resource units in the first frequency domain region.

The first time region and the second time region are in a same slot and do not overlap with each other. For example, when a slot includes 14 OFDM (orthogonal frequency division multiplexing) symbols, the first time region includes an OFDM symbol 0 to an OFDM symbol 6 in the slot, and the second time region includes an OFDM symbol 7 to an OFDM symbol 13 in the slot.

Optionally, the first time region and the second time region are two adjacent slots, the first time region is slot of an even number, and the first time region is a slot of an odd number.

The network device may configure time domain lengths of the first time region and the second time region by using higher layer signaling or dynamic signaling.

Optionally, in the second time region, the number n3 may be determined by using the following formula $(n2-K_0+M) \mod N+K_0$, where $K_0$ is a number of the first physical resource unit in the first frequency domain region, and N is the quantity of physical resource units in the first frequency domain region.

Optionally, a value of M is half of the quantity N of physical resource units in the first frequency domain region. That is, $M=0.5 \times N$.

Optionally, each first set may be a unit of virtual resource unit number interleaving. In this scenario, there are N virtual resource units in each first set and/or N physical resource units in each first frequency domain region. A value of N is 24, 32, or 48, or may be an integer multiple of the foregoing value. N is preconfigured by the network device or configured by using higher layer signaling.

According to the method provided in this embodiment of this application, the system bandwidth of the communications system is divided into a plurality of interleaving regions. Each interleaving region includes at least one physical resource unit contiguous in frequency domain. When allocating a resource to each terminal device, the network device first determines at least one frequency domain region in a bandwidth region used by the terminal device, where the at least one frequency domain region completely overlaps at least one interleaving region in frequency domain. Then, the network device may send, to the terminal device, information used to indicate a type of a virtual resource unit in at least one first set corresponding to the at least one frequency domain region. In the communications system, the system bandwidth is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

Based on the foregoing embodiment, when bandwidth regions used by a plurality of terminal devices overlap, the network device may use a plurality of technical means to avoid resource congestion and collision that occur when physical resource units are scheduled for the plurality of terminal devices.

Based on the foregoing embodiment, when bandwidth regions used by a plurality of terminal devices overlap, the network device may use a plurality of technical implementation means to avoid resource congestion and collision that occur when physical resource units are scheduled for the plurality of terminal devices.

For example, as shown in FIG. 9, the system bandwidth of the communications system includes eight interleaving regions (interleaving regions 0 to 7). When the network device in the communications system needs to allocate a downlink data channel resource to a terminal device a and a terminal device b, the network device determines a bandwidth region a used by the terminal device a, and a bandwidth region b used by the terminal device b.

The network device determines three first frequency domain regions a in the bandwidth region a, including a first frequency domain region a1, a first frequency domain region a2, and a first frequency domain region a3. The first frequency domain region a1 completely overlaps the interleaving region 3 in frequency domain, the first frequency domain region a2 completely overlaps the interleaving region 4 in frequency domain, and the first frequency domain region a3 completely overlaps the interleaving region 5 in frequency domain.

The network device determines three first frequency domain regions b in the bandwidth region b, including a first frequency domain region b1, a first frequency domain region b2, and a first frequency domain region b3. The first frequency domain region b1 completely overlaps the interleaving region 4 in frequency domain, the first frequency domain region b2 completely overlaps the interleaving region 5 in frequency domain, and the first frequency domain region b3 completely overlaps an interleaving region 6 in frequency domain.

In a first scenario, the network device may indicate, by using higher layer signaling, a type of a virtual resource unit in a first set a corresponding to each first frequency domain region a. In addition, the network device may indicate, by using higher layer signaling, a type of a virtual resource unit in a first set b corresponding to each first frequency domain region b.

Figure 9A:
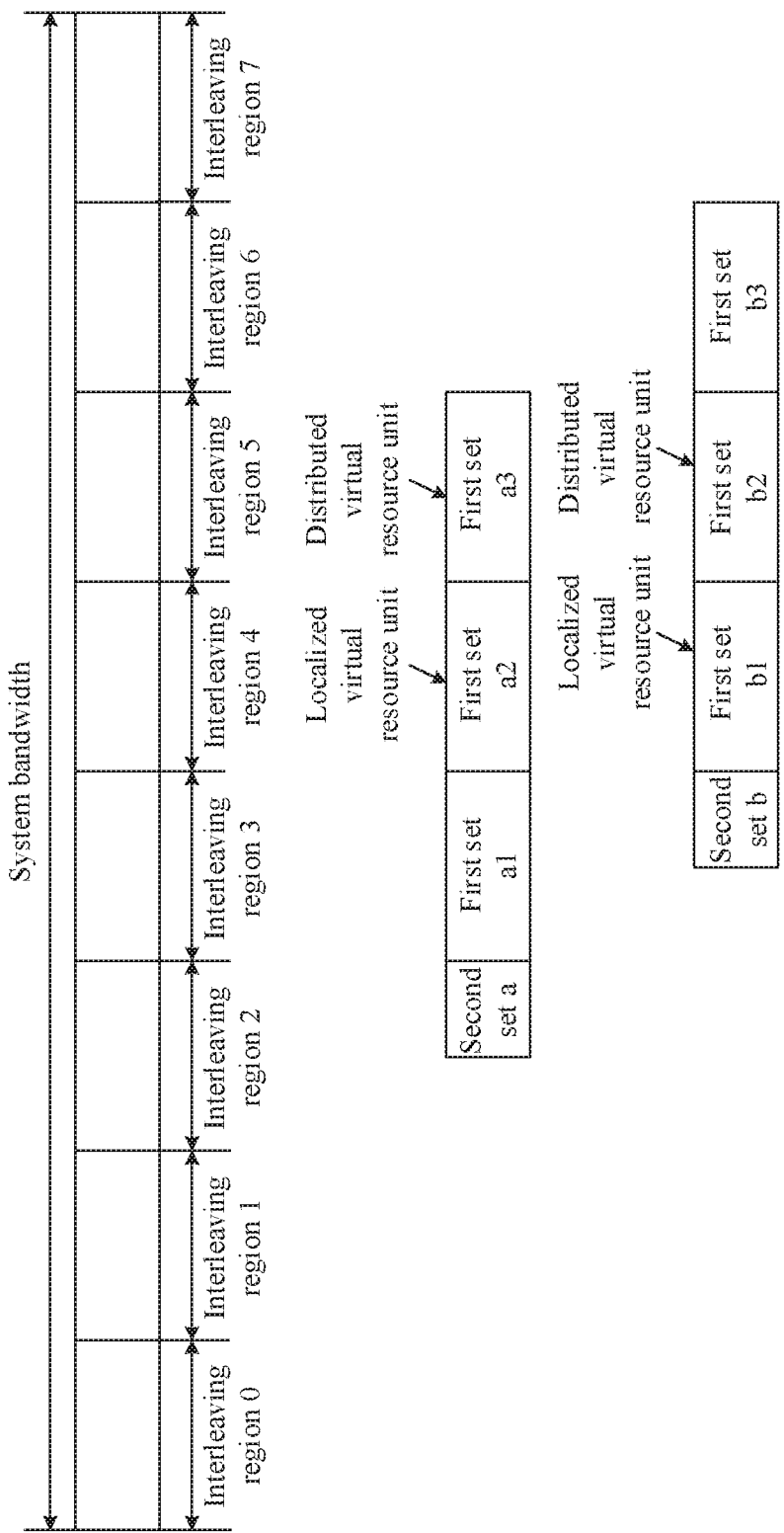
FIG. 9A is an example of a first type design diagram of a virtual resource unit according to an embodiment of this application.

Optionally, in the first scenario, the network device may set, in the first set a and the first set b, types of virtual resource units in first sets whose corresponding first frequency domain regions overlap to be the same. As shown in FIG. 9A, the network device notifies, by using higher layer signaling, the terminal device a that a type of a virtual resource unit in the first set a2 is a localized virtual resource unit, and notifies, by using higher layer signaling, the terminal device b that a type of a virtual resource unit in the first set b1 is a localized virtual resource unit. Similarly, the network device notifies, by using higher layer signaling, the terminal device a that a type of a virtual resource unit in the first set a3 is a distributed virtual resource unit, and notifies, by using higher layer signaling, the terminal device b that a type of a virtual resource unit in the first set b2 is a distributed virtual resource unit.

In this way, for different terminal devices, in the first sets whose corresponding first frequency domain regions overlap, manners of mapping a virtual resource unit to a physical resource unit are completely the same. In this case, when the network device simultaneously schedules virtual resource units for the terminal device a and the terminal device b in the first sets whose corresponding first frequency domain regions overlap, it only needs to be ensured that virtual resource units scheduled for different terminal devices are orthogonal to each other. In this way, resource congestion and collision that occur when physical resource units are scheduled for the plurality of terminal devices can be completely avoided.

Figure 9B:
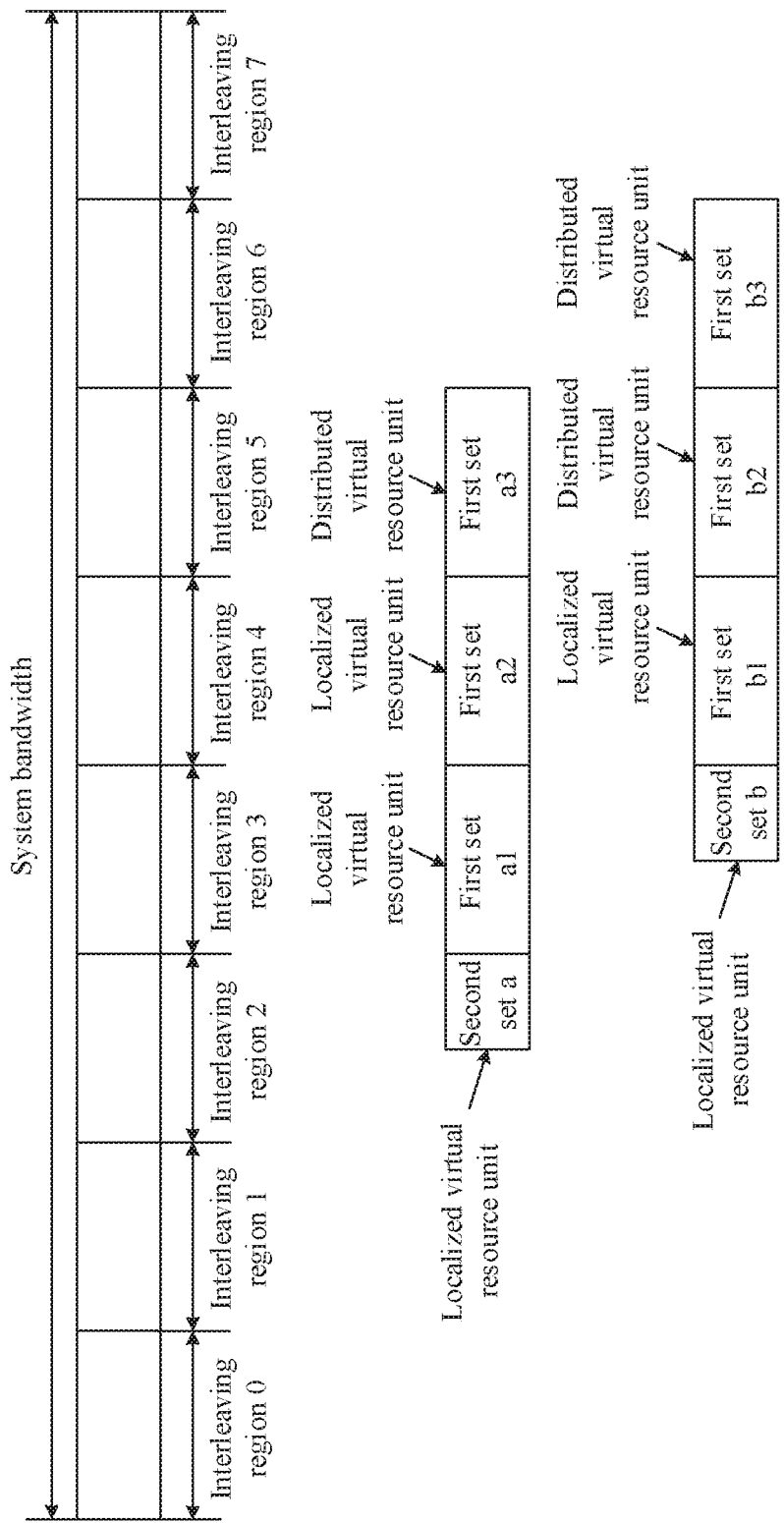
FIG. 9B is an example of a second type design diagram of a virtual resource unit according to an embodiment of this application.

In addition, the second set b and the second set a may also participate in scheduling. In addition, to ensure that a physical resource unit to which the second set a is mapped is still in a second frequency domain region a corresponding to the second set a, and a physical resource unit to which the second set b is mapped is still located in a second frequency domain region b corresponding to the second set b, types of virtual resource units in the second set a and the second set b both need to be localized virtual resource units, to ensure resource utilization. Therefore, optionally, the network device may indicate a type of a virtual resource unit in each first set a and a type of a virtual resource unit in each second set b by using higher layer signaling, as shown in FIG. 9B.

Optionally, in the first scenario, the network device may also set types of virtual resource units in the first sets whose corresponding first frequency domain regions overlap to be the same. In this case, when the network device simultaneously schedules virtual resource units for the terminal device a and the terminal device b, in one of the first sets whose corresponding first frequency domain regions overlap, the network device schedules the virtual resource unit for only one terminal device, to avoid resource congestion and collision that occur when physical resource units are scheduled for the plurality of terminal devices.

Figure 9C:
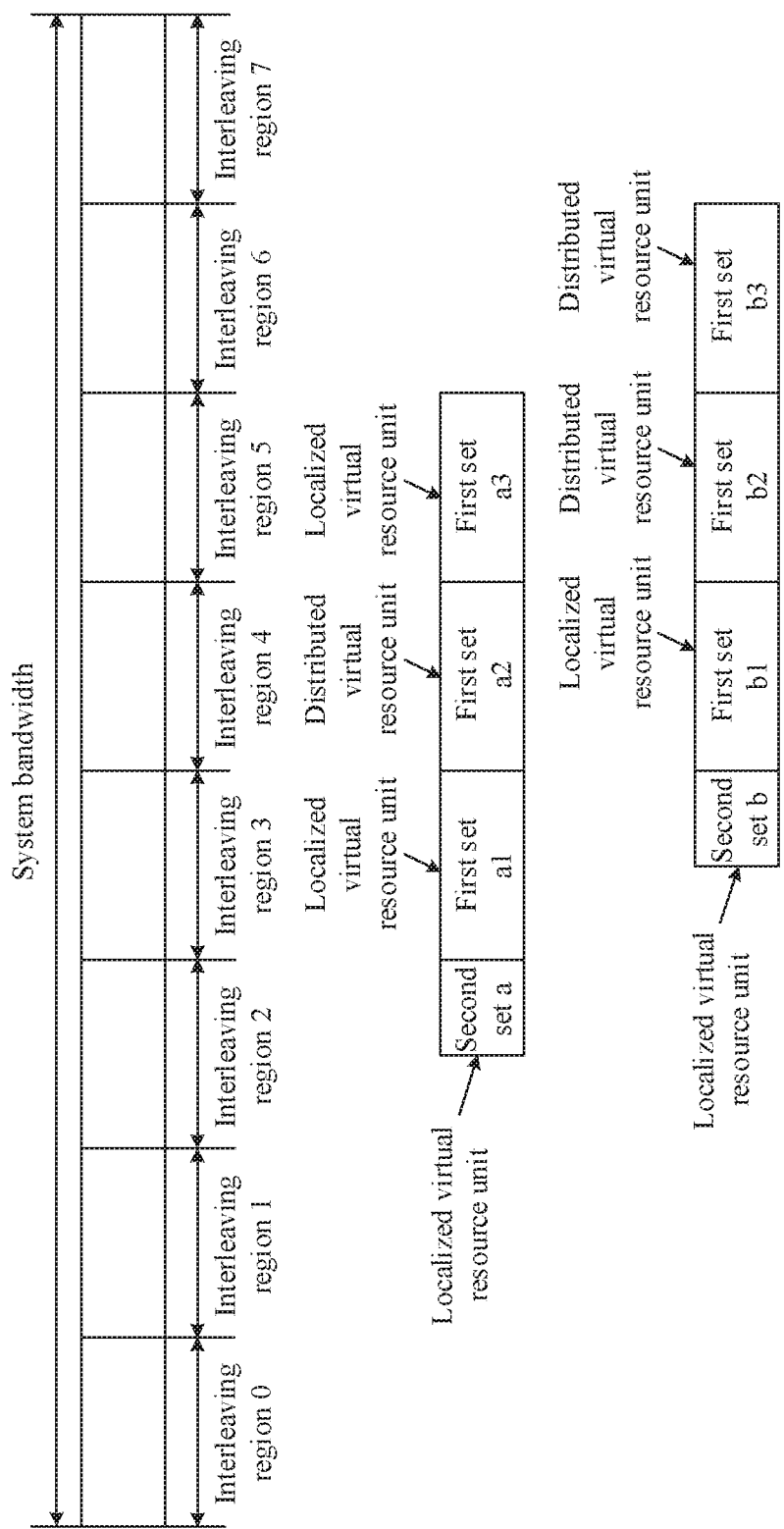
FIG. 9C is an example of a third type design diagram of a virtual resource unit according to an embodiment of this application.
Figure 9D:
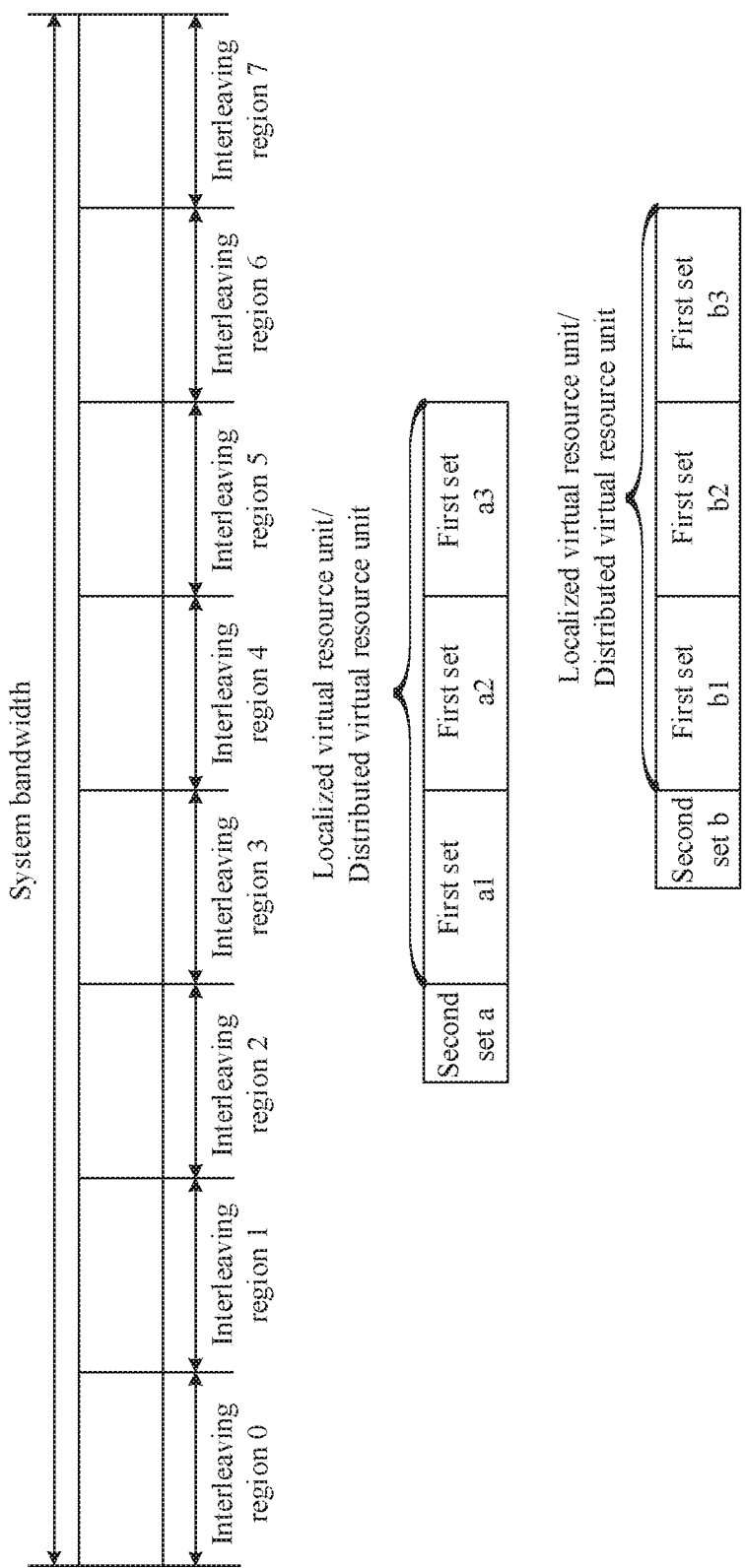
FIG. 9D is an example of a fourth type design diagram of a virtual resource unit according to an embodiment of this application.

For example, when types of virtual resource units in sets of the terminal device a and the terminal device b are shown in FIG. 9C, if the network device schedules a virtual resource unit for the terminal device a in the first set a2, the network device no longer schedules a virtual resource unit for the terminal device b in the first set b1.

In a second scenario, the network device may indicate, by using dynamic signaling, types of virtual resource units in all the first sets a corresponding to all the first frequency domain regions a; and the network device may indicate, by using dynamic signaling, types of virtual resource units in all the first sets b corresponding to all the first frequency domain regions b.

Optionally, in the second scenario, the network device may set, in all the first sets a and all the first sets b, types of virtual resource units in first sets whose corresponding first frequency domain regions overlap to be the same.

In this way, for different terminal devices, in the first sets whose corresponding first frequency domain regions overlap, manners of mapping a virtual resource unit to a physical resource unit are completely the same. In this case, when the network device simultaneously schedules virtual resource units for the terminal device a and the terminal device b in the first sets whose corresponding first frequency domain regions overlap, it only needs to be ensured that virtual resource units scheduled for different terminal devices are orthogonal to each other. In this way, resource congestion and collision that occur when physical resource units are scheduled for the plurality of terminal devices can be completely avoided.

Optionally, in the second scenario, the network device may set, in all the first sets a and all the first sets b, types of virtual resource units in the first sets whose corresponding first frequency domain regions overlap to be different. In this case, when the network device simultaneously schedules virtual resource units for the terminal device a and the terminal device b, in one of the first sets whose corresponding first frequency domain regions overlap, the network device schedules the virtual resource unit for only one terminal device, to avoid resource congestion and collision that occur when physical resource units are scheduled for the plurality of terminal devices.

It should be noted that, when the network device sets the types of the virtual resource units in all the first sets a to localized virtual resource units, virtual resource units in the second set a may also participate in scheduling, and the type of the virtual resource unit in the second set a is a localized virtual resource unit by default. When the network device sets the types of the virtual resource units in all the first sets a to distributed virtual resource units, virtual resource units in the second set a do not participate in scheduling.

For whether the virtual resource unit in the second set b participates in scheduling, and for the type of the virtual resource unit, refer to the foregoing descriptions of the virtual resource unit in the second set a. Details are not described again.

Figure 10:
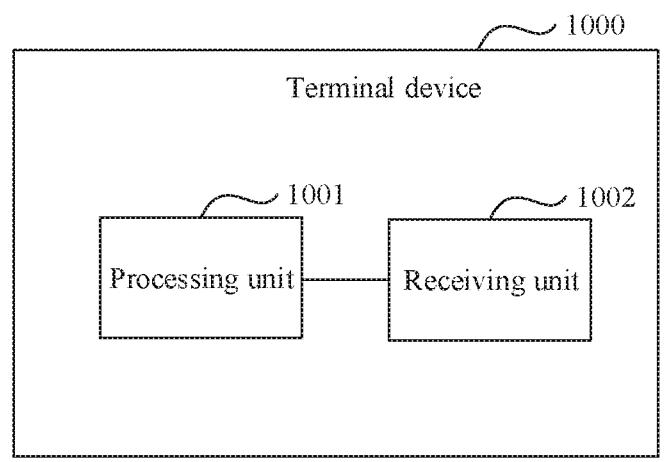
FIG. 10 is a first schematic structural diagram of a terminal device according to an embodiment of this application.

Based on the foregoing embodiments, this application further provides a terminal device. The terminal device is configured to implement the resource allocation method shown in FIG. 5. The terminal device is applied to the communications system shown in FIG. 4. Referring to FIG. 10, the terminal device 1000 includes a processing unit 1001 and a receiving unit 1002.

The processing unit 1001 is configured to determine one or more bandwidth regions in system bandwidth that are used by the terminal device, where the terminal device receives or sends a data channel in the bandwidth region, the system bandwidth includes at least one interleaving region, each interleaving region includes at least one physical resource unit contiguous in frequency domain, each bandwidth region includes at least one first frequency domain region non-overlapping in frequency domain, each first frequency domain region completely overlaps at least one interleaving region in frequency domain, the at least one first frequency domain region is in a one-to-one correspondence with at least one first set, and each first set includes at least one virtual resource unit.

The receiving unit 1002 is configured to receive indication information sent by a network device, where the indication information is used to indicate a type of a virtual resource unit in the at least one first set.

Optionally, the type of the virtual resource unit in the first set is a localized virtual resource unit or a distributed virtual resource unit.

Optionally, a quantity of virtual resource units in each first set is equal to a quantity of physical resource units in a first frequency domain region corresponding to the first set, and the virtual resource unit in each first set is mapped to a physical resource unit in the first frequency domain region corresponding to the first set.

Optionally, each bandwidth region further includes at least one second frequency domain region non-overlapping in frequency domain, each second frequency domain region partially overlaps at least one interleaving region in frequency domain, the at least one second frequency domain region is in a one-to-one correspondence with at least one second set, each second set includes at least one virtual resource unit, and a type of the virtual resource unit in the second set is a localized virtual resource unit.

Optionally, a quantity of virtual resource units in each second set is equal to a quantity of physical resource units in a second frequency domain region corresponding to the second set, and the virtual resource unit in each second set is mapped to a physical resource unit in a frequency domain overlapping part between an interleaving region and the second frequency domain region corresponding to the second set.

Optionally, the indication information is higher layer signaling and is used to indicate a type of the virtual resource unit in each first set.

Optionally, virtual resource units in all the first sets are of a same type, and the indication information is downlink control signaling and is used to indicate the type of the virtual resource units in all the first sets.

Optionally, the processing unit 1001 is further configured to:

determine a number of each virtual resource unit in each first set and a number of each physical resource unit in a first frequency domain region corresponding to the first set, and/or determine a number of each virtual resource unit in each second set and a number of a physical resource unit in a second frequency domain region corresponding to the second set.

When a type of a virtual resource unit in a first set is a localized virtual resource unit, the virtual resource unit in the first set is mapped to a physical resource unit, of a same number as the virtual resource unit, in a first frequency domain region corresponding to the first set; or when a type of a virtual resource unit in a first set is a distributed virtual resource unit, a number of the virtual resource unit in the first set is mapped, by using an interleaving matrix, to a number of a physical resource unit in a frequency domain region corresponding to the first set; and a virtual resource unit in a second set is mapped to a physical resource unit, of a same number as the virtual resource unit, in a second frequency domain region corresponding to the second set.

Optionally, a quantity of rows of the interleaving matrix is a positive integer multiple of 6 or 8.

Optionally, in a first time region, a virtual resource unit numbered n1 in the first set is mapped to a physical resource unit numbered n2 in the first frequency domain region corresponding to the first set; and in a second time region, the virtual resource unit numbered n1 in the first set is mapped to a physical resource unit numbered n3 in the first frequency domain region corresponding to the first set, and the physical resource unit numbered n3 is obtained by cyclically shifting, in frequency domain, the physical resource unit numbered n2 by M physical resource units in the first frequency domain region.

Optionally, the first time region and the second time region are in a same slot and do not overlap with each other.

Optionally, for a bandwidth region, there are N virtual resource units in each first set and/or N physical resource units in each first frequency domain region, and N is preconfigured by the network device or configured by using higher layer signaling.

Optionally, the receiving unit 1002 is further configured to:

receive higher layer signaling sent by the network device, where the higher layer signaling is used to indicate a frequency domain position, in each bandwidth region, of the at least one first frequency domain region and/or the at least one second frequency domain region in the bandwidth region.

This embodiment of this application provides the terminal device. In the solution, the system bandwidth of the communications system is divided into a plurality of interleaving regions. Each interleaving region includes at least one physical resource unit contiguous in frequency domain.

When allocating a resource to each terminal device, the network device first determines at least one frequency domain region in a bandwidth region used by the terminal device, where the at least one frequency domain region completely overlaps at least one interleaving region in frequency domain. Then, the network device can send, to the terminal device, information used to indicate a type of a virtual resource unit in at least one first set corresponding to the at least one frequency domain region. In the communications system, the system bandwidth is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

Figure 11:
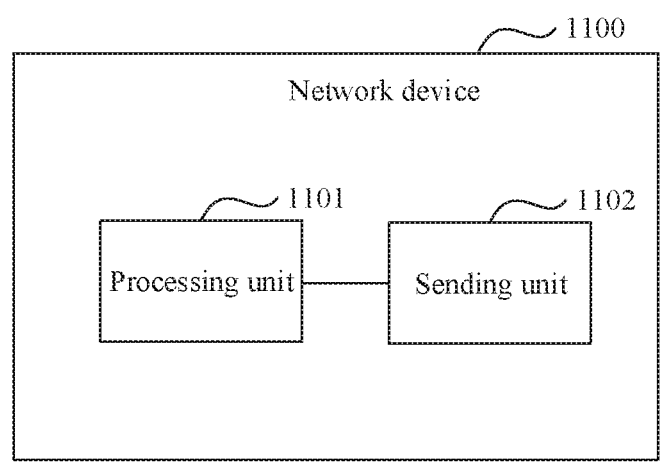
FIG. 11 is a first schematic structural diagram of a network device according to an embodiment of this application.

Based on the foregoing embodiments, this application further provides a network device. The network device is configured to implement the resource allocation method shown in FIG. 5. The network device is applied to the communications system shown in FIG. 4. Referring to FIG. 11, the network device 1100 includes a processing unit 1101 and a sending unit 1102.

The processing unit 1101 is configured to: determine one or more bandwidth regions in system bandwidth that are used by a terminal device, and determine, in the bandwidth region, at least one first frequency domain region non-overlapping in frequency domain, where the terminal device receives or sends a data channel in the bandwidth region, the system bandwidth includes at least one interleaving region, each interleaving region includes at least one physical resource unit contiguous in frequency domain, each first frequency domain region completely overlaps at least one interleaving region in frequency domain, the at least one first frequency domain region is in a one-to-one correspondence with at least one first set, and each first set includes at least one virtual resource unit.

The sending unit 1102 is configured to send indication information to the terminal device, where the indication information is used to indicate a type of a virtual resource unit in the at least one first set.

Optionally, the type of the virtual resource unit in the first set is a localized virtual resource unit or a distributed virtual resource unit.

Optionally, a quantity of virtual resource units in each first set is equal to a quantity of physical resource units in a first frequency domain region corresponding to the first set, and the virtual resource unit in each first set is mapped to a physical resource unit in the first frequency domain region corresponding to the first set.

Optionally, each bandwidth region further includes at least one second frequency domain region non-overlapping in frequency domain, each second frequency domain region partially overlaps at least one interleaving region in frequency domain, the at least one second frequency domain region is in a one-to-one correspondence with at least one second set, each second set includes at least one virtual resource unit, and a type of the virtual resource unit in the second set is a localized virtual resource unit.

Optionally, a quantity of virtual resource units in each second set is equal to a quantity of physical resource units in a second frequency domain region corresponding to the second set, and the virtual resource unit in each second set is mapped to a physical resource unit in a frequency domain overlapping part between an interleaving region and the second frequency domain region corresponding to the second set.

Optionally, the indication information is higher layer signaling and is used to indicate a type of the virtual resource unit in each first set.

Optionally, virtual resource units in all the first sets are of a same type, and the indication information is downlink control signaling and is used to indicate the type of the virtual resource units in all the first sets.

Optionally, the processing unit 1101 is further configured to:

determine a number of each virtual resource unit in each first set and a number of each physical resource unit in a first frequency domain region corresponding to the first set, and/or determine a number of each virtual resource unit in each second set and a number of a physical resource unit in a second frequency domain region corresponding to the second set.

When a type of a virtual resource unit in a first set is a localized virtual resource unit, the virtual resource unit in the first set is mapped to a physical resource unit, of a same number as the virtual resource unit, in a first frequency domain region corresponding to the first set; or when a type of a virtual resource unit in a first set is a distributed virtual resource unit, a number of the virtual resource unit in the first set is mapped, by using an interleaving matrix, to a number of a physical resource unit in a frequency domain region corresponding to the first set; and a virtual resource unit in a second set is mapped to a physical resource unit, of a same number as the virtual resource unit, in a second frequency domain region corresponding to the second set.

Optionally, a quantity of rows of the interleaving matrix is a positive integer multiple of 6 or 8.

Optionally, in a first time region, a virtual resource unit numbered n1 in the first set is mapped to a physical resource unit numbered n2 in the first frequency domain region corresponding to the first set; and in a second time region, the virtual resource unit numbered n1 in the first set is mapped to a physical resource unit numbered n3 in the first frequency domain region corresponding to the first set, and the physical resource unit numbered n3 is obtained by cyclically shifting, in frequency domain, the physical resource unit numbered n2 by M physical resource units in the first frequency domain region.

Optionally, the first time region and the second time region are in a same slot and do not overlap with each other.

Optionally, for a bandwidth region, there are N virtual resource units in each first set and/or N physical resource units in each first frequency domain region, and N is preconfigured by the network device or configured by using higher layer signaling.

Optionally, the sending unit 1102 is further configured to:

send higher layer signaling to the terminal device, where the higher layer signaling is used to indicate a frequency domain position, in each bandwidth region of the terminal device, of the at least one first frequency domain region and/or the at least one second frequency domain region in the bandwidth region.

This embodiment of this application provides the network device. In the solution, the system bandwidth of the communications system is divided into a plurality of interleaving regions. Each interleaving region includes at least one physical resource unit contiguous in frequency domain. When allocating a resource to each terminal device, the network device first determines at least one frequency domain region in a bandwidth region used by the terminal device, where the at least one frequency domain region completely overlaps at least one interleaving region in frequency domain. Then, the network device may send, to the terminal device, information used to indicate a type of a virtual resource unit in at least one first set corresponding to the at least one frequency domain region. In the communications system, the system bandwidth is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

It should be understood that the foregoing division of the units of the terminal device and the network device is merely division of logical functions, and in actual implementation, all or some of the units may be integrated into one physical entity, or may be physically separated. In addition, all of the units may be implemented in a form of software invoked by a processing element, or may be implemented in a form of hardware: or some of the units may be implemented in a form of software invoked by a processing element, and some of the units may be implemented in a form of hardware. For example, the processing unit of the network device may be a separately disposed processing element, or may be integrated into a chip in the network device. Alternatively, the processing unit may be stored as a program in a memory of the network device and invoked by a processing element of the network device to perform a function of the unit. Implementation of another unit is similar to that of the processing unit. In addition, all or some of the units may be integrated together, or may be implemented independently. The processing element herein may be an integrated circuit and has a signal processing capability. In an implementation process, steps in the foregoing methods or the foregoing units can be implemented by using a hardware integrated logical circuit in the processing element, or by using instructions in a form of software. In addition, the foregoing receiving unit in the network device is a receiving control unit, and can receive, by using a receiving apparatus such as an antenna or a radio frequency apparatus of the network device, information sent by a peer end. The foregoing sending unit in the network device is a sending control unit, and can send information to the peer end by using a sending apparatus such as an antenna or a radio frequency apparatus of the network device.

For example, the foregoing units may be one or more integrated circuits configured to implement the foregoing method, for example, one or more application-specific integrated circuits (ASIC), one or more microprocessors (DSP), or one or more field programmable gate arrays (FPGA). For another example, when one of the foregoing units is implemented by invoking a program by a processing element, the processing element may be a general purpose processor, for example, a central processing unit (CPU) or another processor that can invoke the program. For another example, the units may be integrated together and implemented in a form of a system-on-a-chip (SOC).

When the units are implemented in the form of a software functional unit and sold or used as an independent product, the units may be stored in a computer storage medium. Based on such an understanding, the technical solutions of this application essentially, or the part contributing to the prior art, or all or some of the technical solutions may be implemented in a form of a software product. The computer software product is stored in a storage medium and includes several instructions for instructing a computer device (which may be, for example, a personal computer, a server, or a network device) or a processor to perform all or some of the steps of the methods described in the embodiments of this application. The foregoing computer storage medium includes any medium that can store program code, such as a USB flash drive, a removable hard disk, a read-only memory (ROM), a random access memory (RAM), a magnetic disk, or an optical disc.

Figure 12:
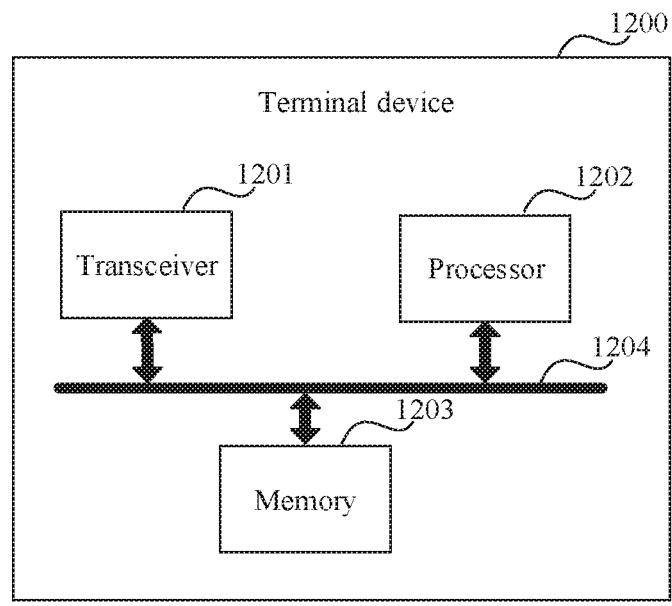
FIG. 12 is a second schematic structural diagram of a terminal device according to an embodiment of this application.

Based on the foregoing embodiments, an embodiment of this application further provides a terminal device. The terminal device is applied to the communications system shown in FIG. 4, is configured to implement the resource allocation method provided in the foregoing embodiments, and has functions of the terminal device 1000 shown in FIG. 10. Referring to FIG. 12, the terminal device 1200 includes a transceiver 1201, a processor 1202, and a memory 1203. The transceiver 1201, the processor 1202, and the memory 1203 are connected to each other.

Optionally, the transceiver 1201, the processor 1202, and the memory 1203 are connected to each other by using a bus 1204. The bus 1204 may be a peripheral component interconnect (PCI) bus, an extended industry standard architecture (EISA) bus, or the like. The bus may be classified into an address bus, a data bus, a control bus, and the like. For ease of representation, only one thick line is used to represent the bus in FIG. 12, but this does not mean that there is only one bus or only one type of bus.

The transceiver 1201 is configured to receive and send data, to implement communication with another device (for example, a network device) in the communications system.

The processor 1202 is configured to implement the resource allocation method provided in the foregoing embodiments. The method includes:

determining one or more bandwidth regions in system bandwidth that are used by the terminal device, where the terminal device receives or sends a data channel in the bandwidth region, the system bandwidth includes at least one interleaving region, each interleaving region includes at least one physical resource unit contiguous in frequency domain, each bandwidth region includes at least one first frequency domain region non-overlapping in frequency domain, each first frequency domain region completely overlaps at least one interleaving region in frequency domain, the at least one first frequency domain region is in a one-to-one correspondence with at least one first set, and each first set includes at least one virtual resource unit; and receiving indication information sent by a network device, where the indication information is used to indicate a type of a virtual resource unit in the at least one first set.

Optionally, the type of the virtual resource unit in the first set is a localized virtual resource unit or a distributed virtual resource unit.

Optionally, a quantity of virtual resource units in each first set is equal to a quantity of physical resource units in a first frequency domain region corresponding to the first set, and the virtual resource unit in each first set is mapped to a physical resource unit in the first frequency domain region corresponding to the first set.

Optionally, each bandwidth region further includes at least one second frequency domain region non-overlapping in frequency domain, each second frequency domain region partially overlaps at least one interleaving region in frequency domain, the at least one second frequency domain region is in a one-to-one correspondence with at least one second set, each second set includes at least one virtual resource unit, and a type of the virtual resource unit in the second set is a localized virtual resource unit.

Optionally, a quantity of virtual resource units in each second set is equal to a quantity of physical resource units in a second frequency domain region corresponding to the second set, and the virtual resource unit in each second set is mapped to a physical resource unit in a frequency domain overlapping part between an interleaving region and the second frequency domain region corresponding to the second set.

Optionally, the indication information is higher layer signaling and is used to indicate a type of the virtual resource unit in each first set.

Optionally, virtual resource units in all the first sets are of a same type, and the indication information is downlink control signaling and is used to indicate the type of the virtual resource units in all the first sets.

Optionally, the processor 1202 is further configured to:

determine a number of each virtual resource unit in each first set and a number of each physical resource unit in a first frequency domain region corresponding to the first set, and/or determine a number of each virtual resource unit in each second set and a number of a physical resource unit in a second frequency domain region corresponding to the second set.

When a type of a virtual resource unit in a first set is a localized virtual resource unit, the virtual resource unit in the first set is mapped to a physical resource unit, of a same number as the virtual resource unit, in a first frequency domain region corresponding to the first set; or when a type of a virtual resource unit in a first set is a distributed virtual resource unit, a number of the virtual resource unit in the first set is mapped, by using an interleaving matrix, to a number of a physical resource unit in a frequency domain region corresponding to the first set; and a virtual resource unit in a second set is mapped to a physical resource unit, of a same number as the virtual resource unit, in a second frequency domain region corresponding to the second set.

Optionally, a quantity of rows of the interleaving matrix is a positive integer multiple of 6 or 8.

Optionally, in a first time region, a virtual resource unit numbered n1 in the first set is mapped to a physical resource unit numbered n2 in the first frequency domain region corresponding to the first set; and in a second time region, the virtual resource unit numbered n1 in the first set is mapped to a physical resource unit numbered n3 in the first frequency domain region corresponding to the first set, and the physical resource unit numbered n3 is obtained by cyclically shifting, in frequency domain, the physical resource unit numbered n2 by M physical resource units in the first frequency domain region.

Optionally, the first time region and the second time region are in a same slot and do not overlap with each other.

Optionally, for a bandwidth region, there are N virtual resource units in each first set and/or N physical resource units in each first frequency domain region, and N is preconfigured by the network device or configured by using higher layer signaling.

Optionally, the processor 1202 is further configured to:

receive, by using the transceiver 1201, higher layer signaling sent by the network device, where the higher layer signaling is used to indicate a frequency domain position, in each bandwidth region, of the at least one first frequency domain region and/or the at least one second frequency domain region in the bandwidth region.

The memory 1203 is configured to store a program instruction and the like. Specifically, the program instruction may include program code, and the program code includes a computer operation instruction. The memory 1203 may include a random access memory (RAM), or may include a non-volatile memory, for example, at least one magnetic disk memory. The processor 1202 executes the program instruction stored in the memory 1203, to implement the foregoing functions, thereby implementing the resource allocation method provided in the foregoing embodiments.

Figure 13:
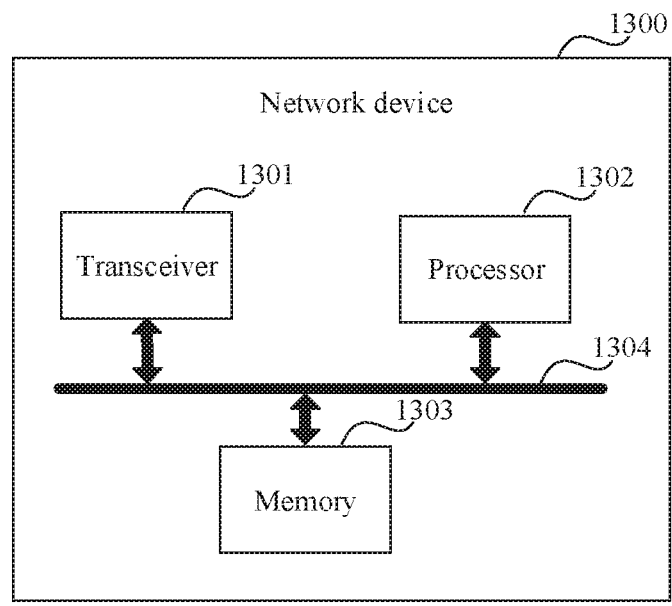
FIG. 13 is a second schematic structural diagram of a network device according to an embodiment of this application.

Based on the foregoing embodiments, an embodiment of this application further provides a network device. The network device is applied to the communications system shown in FIG. 4, and is configured to implement the resource allocation method provided in the foregoing embodiments. The network device has functions of the network device 1100 shown in FIG. 11. Referring to FIG. 13, the network device 1300 includes a transceiver 1301, a processor 1302, and a memory 1303. The transceiver 1301, the processor 1302, and the memory 1303 are connected to each other.

Optionally, the transceiver 1301, the processor 1302, and the memory 1303 are connected to each other by using a bus 1304. The bus 1304 may be a PCI bus, an EISA bus, or the like. The bus may be classified into an address bus, a data bus, a control bus, and the like. For ease of representation, only one thick line is used to represent the bus in FIG. 13, but this does not mean that there is only one bus or only one type of bus.

The transceiver 1301 is configured to receive and send data, to implement communication with another device (for example, a terminal device) in the communications system.

The processor 1302 is configured to implement the resource allocation method provided in the foregoing embodiments. The method includes:

determining one or more bandwidth regions in system bandwidth that are used by a terminal device, and determining, in the bandwidth region, at least one first frequency domain region non-overlapping in frequency domain, where the terminal device receives or sends a data channel in the bandwidth region, the system bandwidth includes at least one interleaving region, each interleaving region includes at least one physical resource unit contiguous in frequency domain, each first frequency domain region completely overlaps at least one interleaving region in frequency domain, the at least one first frequency domain region is in a one-to-one correspondence with at least one first set, and each first set includes at least one virtual resource unit; and sending indication information to the terminal device, where the indication information is used to indicate a type of a virtual resource unit in the at least one first set.

Optionally, the type of the virtual resource unit in the first set is a localized virtual resource unit or a distributed virtual resource unit.

Optionally, a quantity of virtual resource units in each first set is equal to a quantity of physical resource units in a first frequency domain region corresponding to the first set, and the virtual resource unit in each first set is mapped to a physical resource unit in the first frequency domain region corresponding to the first set.

Optionally, each bandwidth region further includes at least one second frequency domain region non-overlapping in frequency domain, each second frequency domain region partially overlaps at least one interleaving region in frequency domain, the at least one second frequency domain region is in a one-to-one correspondence with at least one second set, each second set includes at least one virtual resource unit, and a type of the virtual resource unit in the second set is a localized virtual resource unit.

Optionally, a quantity of virtual resource units in each second set is equal to a quantity of physical resource units in a second frequency domain region corresponding to the second set, and the virtual resource unit in each second set is mapped to a physical resource unit in a frequency domain overlapping part between an interleaving region and the second frequency domain region corresponding to the second set.

Optionally, the indication information is higher layer signaling and is used to indicate a type of the virtual resource unit in each first set.

Optionally, virtual resource units in all the first sets are of a same type, and the indication information is downlink control signaling and is used to indicate the type of the virtual resource units in all the first sets.

Optionally, the processor 1302 is further configured to:

determine a number of each virtual resource unit in each first set and a number of each physical resource unit in a first frequency domain region corresponding to the first set, and/or determine a number of each virtual resource unit in each second set and a number of a physical resource unit in a second frequency domain region corresponding to the second set.

When a type of a virtual resource unit in a first set is a localized virtual resource unit, the virtual resource unit in the first set is mapped to a physical resource unit, of a same number as the virtual resource unit, in a first frequency domain region corresponding to the first set; or when a type of a virtual resource unit in a first set is a distributed virtual resource unit, a number of the virtual resource unit in the first set is mapped, by using an interleaving matrix, to a number of a physical resource unit in a frequency domain region corresponding to the first set; and a virtual resource unit in a second set is mapped to a physical resource unit, of a same number as the virtual resource unit, in a second frequency domain region corresponding to the second set.

Optionally, a quantity of rows of the interleaving matrix is a positive integer multiple of 6 or 8.

Optionally, in a first time region, a virtual resource unit numbered n1 in the first set is mapped to a physical resource unit numbered n2 in the first frequency domain region corresponding to the first set; and in a second time region, the virtual resource unit numbered n1 in the first set is mapped to a physical resource unit numbered n3 in the first frequency domain region corresponding to the first set, and the physical resource unit numbered n3 is obtained by cyclically shifting, in frequency domain, the physical resource unit numbered n2 by M physical resource units in the first frequency domain region.

Optionally, the first time region and the second time region are in a same slot and do not overlap with each other.

Optionally, for a bandwidth region, there are N virtual resource units in each first set and/or N physical resource units in each first frequency domain region, and N is preconfigured by the network device or configured by using higher layer signaling.

Optionally, the processor 1302 is further configured to:

send, by using the transceiver 1301, higher layer signaling to the terminal device, where the higher layer signaling is used to indicate a frequency domain position, in each bandwidth region of the terminal device, of the at least one first frequency domain region and/or the at least one second frequency domain region in the bandwidth region.

The memory 1303 is configured to store a program instruction and the like. Specifically, the program instruction may include program code, and the program code includes a computer operation instruction. The memory 1303 may include a random access memory (RAM), or may include a non-volatile memory, for example, at least one magnetic disk memory. The processor 1302 executes the program instruction stored in the memory 1303, to implement the foregoing functions, thereby implementing the resource allocation method provided in the foregoing embodiments.

Figure 14:
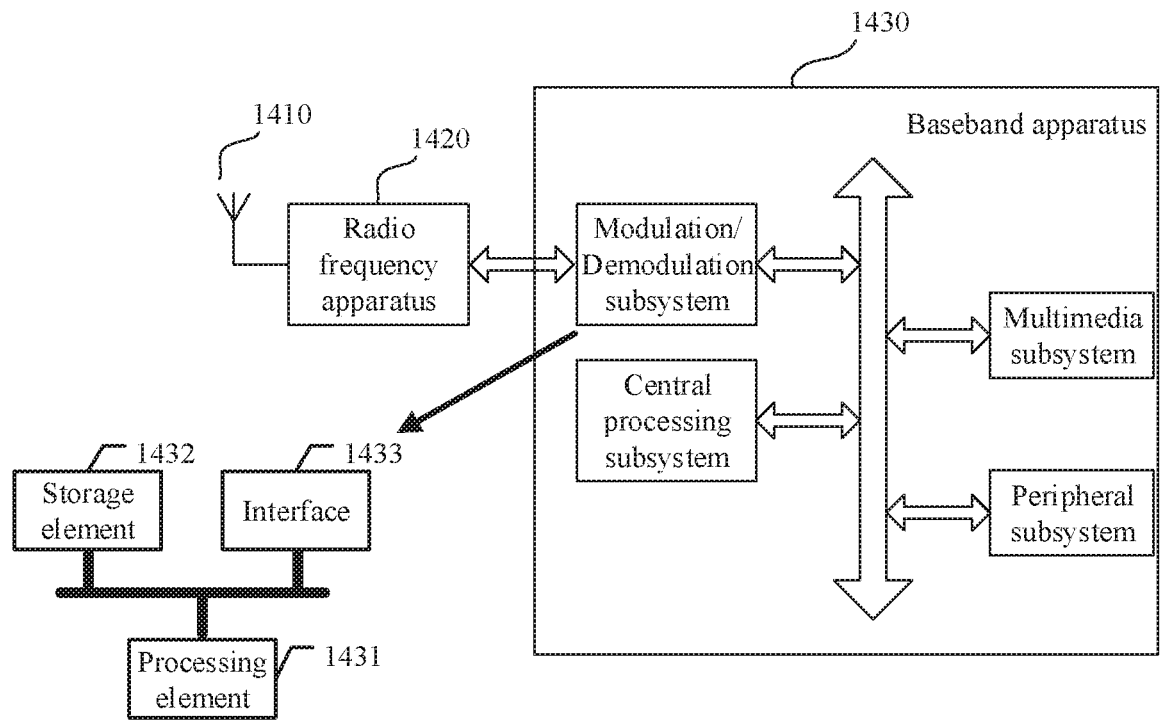
FIG. 14 is a third schematic structural diagram of a terminal device according to an embodiment of this application.

FIG. 14 is a schematic structural diagram of a terminal device according to an embodiment of this application. The terminal device may be the terminal device in the foregoing embodiments, and is configured to implement operations of the terminal device in the foregoing embodiments. As shown in FIG. 14, the terminal device includes an antenna 1410, a radio frequency apparatus 1420, and a baseband apparatus 1430. The antenna 1410 is connected to the radio frequency apparatus 1420. In a downlink direction, the radio frequency apparatus 1420 receives, by using the antenna 1410, information sent by a network device, and sends, to the baseband apparatus 1430 for processing, the information sent by the network device. In an uplink direction, the baseband apparatus 1430 processes information from the terminal device and sends processed information to the radio frequency apparatus 1420, and the radio frequency apparatus 1420 processes the information from the terminal device and then sends processed information to the network device by using the antenna 1410.

The baseband apparatus 1430 may include a modulation/demodulation subsystem, configured to implement data processing in each communications protocol layer. The baseband apparatus 1430 may further include a central processing subsystem, configured to implement processing of an operating system and an application layer of the terminal device. In addition, the baseband apparatus 1430 may further include other subsystems, for example, a multimedia subsystem and a peripheral subsystem. The multimedia subsystem is configured to control a camera, screen display, or the like of the terminal device, and the peripheral subsystem is configured to implement connections to another device. The modulation/demodulation subsystem may be a chip that is separately disposed. Optionally, the foregoing terminal device may be implemented in the modulation/demodulation subsystem.

In an implementation, each unit shown in FIG. 14 is implemented by invoking a program by a processing element. For example, a subsystem, such as the modulation/demodulation subsystem, of the baseband apparatus 1430 includes a processing element 1431 and a storage element 1432. The processing element 1431 invokes a program stored in the storage element 1432 to perform the method performed by the terminal device in the foregoing method embodiments. In addition, the baseband apparatus 1430 may further include an interface 1433, configured to exchange information with the radio frequency apparatus 1420.

In another implementation, each unit shown in FIG. 10 may be one or more processing elements configured to implement the method performed by the terminal device. These processing elements are disposed in a subsystem, such as the modulation/demodulation subsystem, of the baseband apparatus 1430. The processing element herein may be an integrated circuit, for example, one or more ASICs, one or more DSPs. or one or more FPGAs. These integrated circuits may be integrated together to form a chip.

For example, the units shown in FIG. 10 may be integrated together, and implemented in a form of a system-on-a-chip (SOC). For example, the baseband apparatus 1430 includes an SOC chip configured to implement the foregoing method. The processing element 1431 and the storage element 1432 may be integrated into the chip, and the processing element 1431 invokes the program stored in the storage element 1432 to implement the foregoing method performed by the terminal device or functions of the units shown in FIG. 10. Alternatively, at least one integrated circuit may be integrated into the chip, to implement the foregoing method performed by the terminal device or functions of the units shown in FIG. 10. Alternatively, the foregoing implementations may be combined, where functions of some units are implemented by invoking a program by a processing element, and functions of some units are implemented in a form of an integrated circuit.

Regardless of which manner is used, the terminal device includes at least one processing element and a storage element. The at least one processing element is configured to perform the method that is performed by the terminal device and that is provided in the foregoing method embodiments. The processing element may perform, in a first manner, to be specific, in the manner of executing a program stored in the storage element, some or all steps performed by the terminal device in the foregoing method embodiments. Alternatively, the processing element may perform, in a second manner, to be specific, in the manner of combining an instruction and an integrated logic circuit of hardware in the processor element, some or all steps performed by the terminal device in the foregoing method embodiments. Certainly, some or all steps performed by the terminal device in the foregoing method embodiments may be alternatively performed by combining a first manner and a second manner.

As described above, the processing element herein may be a general purpose processor, for example, a central processing unit (CPU), or may be one or more integrated circuits configured to implement the foregoing method, for example, one or more application-specific integrated circuits (ASIC), one or more microprocessors (DSP), or one or more field programmable gate arrays (FPGA).

The storage element may be a memory, or may be a general term of a plurality of storage elements.

Figure 15:
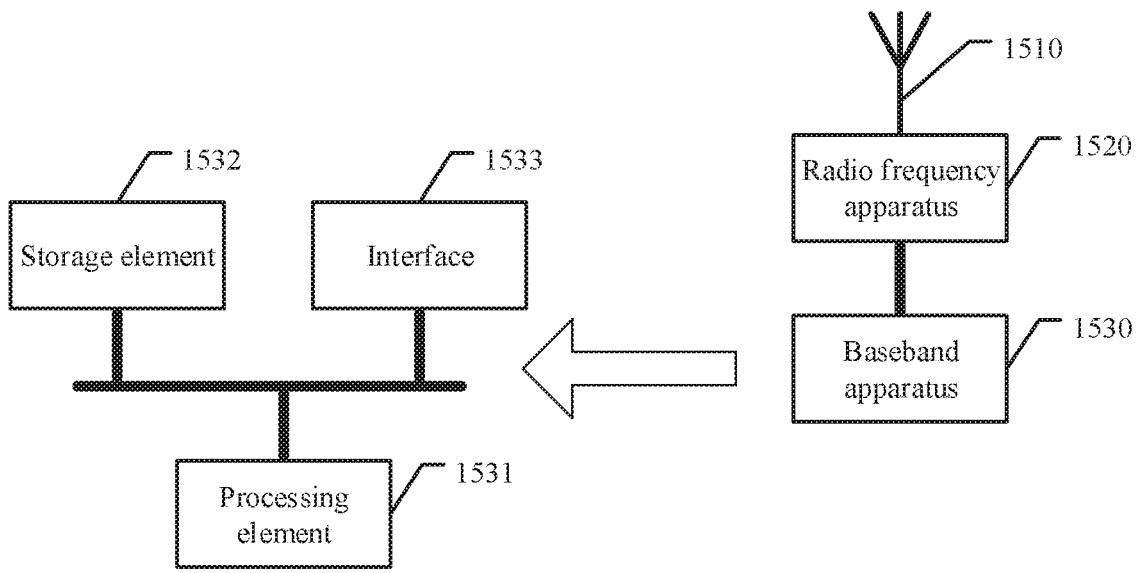
FIG. 15 is a third schematic structural diagram of a network device according to an embodiment of this application.

FIG. 15 is a schematic structural diagram of a network device according to an embodiment of this application. The network device may be the network device in the foregoing embodiments, and is configured to implement operations of the network device in the foregoing embodiments. As shown in FIG. 15, the network device includes an antenna 1510, a radio frequency apparatus 1520, and a baseband apparatus 1530. The antenna 1510 is connected to the radio frequency apparatus 1520. In an uplink direction, the radio frequency apparatus 1520 receives, by using the antenna 1510, information sent by a terminal device, and sends the information sent by the terminal device, to the baseband apparatus 1530 for processing. In a downlink direction, the baseband apparatus 1530 processes information from the terminal device and sends processed information to the radio frequency apparatus 1520, and the radio frequency apparatus 1520 processes the information from the terminal device and then sends processed information to the terminal device by using the antenna 1510.

The baseband apparatus 1530 may be a physical apparatus, or may include at least two physically separated apparatuses, for example, including a CU and at least one DU. The DU and the radio frequency apparatus 1520 may be integrated into an apparatus, or may be separated physically. No limitation is imposed on division, at protocol layers, of the at least two apparatuses of the baseband apparatus 1530 that are separated physically. For example, the baseband apparatus 1530 is configured to perform processing of protocol layers such as RRC, PDCP, RLC, MAC, and a physical layer, and division may be performed between any two protocol layers, so that the baseband apparatus includes two physically separated apparatuses, and each of the two apparatuses is configured to perform processing at a protocol layer that the apparatus is responsible for. For example, division is performed between RRC and PDCP. For another example, division may be performed between PDCP and RLC. In addition, division may be performed within a protocol layer. For example, a part of a protocol layer and a protocol layer above the protocol layer are assigned to one apparatus, and a remaining part of the protocol layer and a protocol layer below the protocol layer are assigned to the other apparatus. The network device may be located on one of the at least two physically separated apparatuses of the baseband apparatus 1530.

The network device may include a plurality of baseband boards. A plurality of processing elements may be integrated onto the baseband board to implement required functions. The baseband apparatus 1530 may include at least one baseband board, and the network device may be located on the baseband apparatus 1530. In an implementation, each unit shown in FIG. 11 is implemented by invoking a program by a processing element. For example, the baseband apparatus 1530 includes a processing element 1531 and a storage element 1532. The processing element 1531 invokes a program stored in the storage element 1532 to perform the method performed by the network device in the foregoing method embodiments. In addition, the baseband apparatus 1530 may further include an interface 1533, configured to exchange information with the radio frequency apparatus 1520. The interface is, for example, a common public radio interface (CPRI). When the baseband apparatus 1530 and the radio frequency apparatus 1520 are deployed together physically, the interface 1531 may be an intra-board interface or an inter-board interface, and the board herein is a circuit board.

In another implementation, each unit shown in FIG. 11 may be one or more processing elements configured to implement the method performed by the network device. These processing elements are disposed on the baseband apparatus 1530. The processing element herein may be an integrated circuit, for example, one or more ASICs, one or more DSPs, or one or more FPGAs. These integrated circuits may be integrated together to form a chip.

For example, the units shown in FIG. 11 may be integrated together, and implemented in a form of a system-on-a-chip (SOC). For example, the baseband apparatus 1530 includes an SOC chip configured to implement the foregoing method. The processing element 1531 and the storage element 1532 may be integrated into the chip, and the processing element 1531 invokes the program stored in the storage element 1532 to implement the method performed by the network device or functions of the units shown in FIG. 11. Alternatively, at least one integrated circuit may be integrated into the chip, to implement the method performed by the network device or functions of the units shown in FIG. 11. Alternatively, the foregoing implementations may be combined, where functions of some units are implemented by invoking a program by a processing element, and functions of some units are implemented in a form of an integrated circuit.

Regardless of which manner is used, the network device includes at least one processing element and a storage element. The at least one processing element is configured to perform the method that is performed by the network device and that is provided in the foregoing method embodiments.

The processing element may perform, in a first manner, to be specific, in the manner of executing the program stored in the storage element, some or all steps performed by the network device in the foregoing method embodiments. Alternatively, the processing element may perform, in a second manner, to be specific, in the manner of combining an instruction and an integrated logic circuit of hardware in the processor element, some or all steps performed by the network device in the foregoing method embodiments. Certainly, some or all steps performed by the network device in the foregoing method embodiments may be alternatively performed by combining a first manner and a second manner.

As described above, the processing element herein may be a general purpose processor, for example, a central processing unit (CPU), or may be one or more integrated circuits configured to implement the foregoing method, for example, one or more application specific integrated circuits (ASIC), one or more microprocessors (DSP), or one or more field programmable gate arrays (FPGA).

The storage element may be a memory, or may be a general term of a plurality of storage elements.

In conclusion, the embodiments of this application provide a resource allocation method and a device. In the solution, the system bandwidth of the communications system is divided into a plurality of interleaving regions. Each interleaving region includes at least one physical resource unit contiguous in frequency domain. When allocating a resource to each terminal device, the network device first determines at least one frequency domain region in a bandwidth region used by the terminal device, where the at least one frequency domain region completely overlaps at least one interleaving region in frequency domain. Then, the network device may send, to the terminal device, information used to indicate a type of a virtual resource unit in at least one first set corresponding to the at least one frequency domain region. In the communications system, the system bandwidth is divided into a plurality of fixed interleaving regions. In this case, the network device may indicate the type of the virtual resource unit in a form of a frequency domain range occupied by one interleaving region. Using the foregoing solution can enable the network device to set the type of the virtual resource unit more conveniently, so that the network device can avoid, by using technical means, resource congestion and collision that occur when physical resource units are scheduled for different terminal devices.

A person skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. These computer program instructions may be provided for a general purpose computer, a special purpose computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be alternatively stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be alternatively loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Obviously, a person skilled in the art can make various modifications and variations to this application without departing from the scope of this application. This application is intended to cover these modifications and variations of this application provided that they fall within the scope of protection defined by the following claims and their equivalent technologies.

What is claimed is:

1. A resource allocation method, the method comprising:
    determining one or more bandwidth regions in system bandwidth that are used by a terminal device, wherein the terminal device receives or sends a data channel in the one or more bandwidth regions, wherein the system bandwidth comprises at least one interleaving region, wherein each interleaving region comprises at least one physical resource unit contiguous in frequency domain, wherein each bandwidth region comprises at least one first frequency domain region non-overlapping in frequency domain, wherein each first frequency domain region completely overlaps at least one interleaving region in frequency domain, wherein the at least one first frequency domain region is in a one-to-one correspondence with at least one first set, and wherein each first set comprises at least one virtual resource unit; and
    receiving indication information sent by a network device, wherein the indication information is used to indicate a type of a virtual resource unit in the at least one first set.

2. The method according to claim 1, wherein the type of the virtual resource unit in the first set is a localized virtual resource unit or a distributed virtual resource unit.

3. The method according to claim 1, wherein a quantity of virtual resource units in each first set is equal to a quantity of physical resource units in a first frequency domain region corresponding to the first set, and wherein the virtual resource unit in each first set is mapped to a physical resource unit in the first frequency domain region corresponding to the first set.

4. The method according to claim 1, wherein each bandwidth region further comprises at least one second frequency domain region non-overlapping in frequency domain, wherein each second frequency domain region partially overlaps at least one interleaving region in frequency domain, wherein the at least one second frequency domain region is in a one-to-one correspondence with at least one second set, wherein each second set comprises at least one virtual resource unit, and wherein a type of the virtual resource unit in the second set is a localized virtual resource unit.

5. The method according to claim 4, wherein a quantity of virtual resource units in each second set is equal to a quantity of physical resource units in a second frequency domain region corresponding to the second set, and wherein the virtual resource unit in each second set is mapped to a physical resource unit in a frequency domain overlapping part between an interleaving region and the second frequency domain region corresponding to the second set.

6. The method according to claim 1, wherein the indication information is higher layer signaling and is used to indicate a type of the virtual resource unit in each first set.

7. The method according to claim 1, wherein virtual resource units in all the first sets are of a same type, and wherein the indication information is downlink control signaling and is used to indicate the type of the virtual resource units in all the first sets.

8. The method according to claim 4, wherein the method further comprises at least one of the following:
    determining a number of each virtual resource unit in each first set and a number of each physical resource unit in a first frequency domain region corresponding to the first set; or
    determining a number of each virtual resource unit in each second set and a number of a physical resource unit in a second frequency domain region corresponding to the second set,
    wherein when a type of a virtual resource unit in a first set is a localized virtual resource unit, the virtual resource unit in the first set is mapped to a physical resource unit, of a same number as the virtual resource unit, in a first frequency domain region corresponding to the first set; or
    wherein when a type of a virtual resource unit in a first set is a distributed virtual resource unit, a number of the virtual resource unit in the first set is mapped, by using an interleaving matrix, to a number of a physical resource unit in a frequency domain region corresponding to the first set; and
    wherein a virtual resource unit in a second set is mapped to a physical resource unit, of a same number as the virtual resource unit, in a second frequency domain region corresponding to the second set.

9. The method according to claim 8, wherein a quantity of rows of the interleaving matrix is a positive integer multiple of 6 or 8.

10. The method according to claim 8, wherein in a first time region, a virtual resource unit numbered n1 in the first set is mapped to a physical resource unit numbered n2 in the first frequency domain region corresponding to the first set; and
    wherein in a second time region, the virtual resource unit numbered n1 in the first set is mapped to a physical resource unit numbered n3 in the first frequency domain region corresponding to the first set, and wherein the physical resource unit numbered n3 is obtained by cyclically shifting, in frequency domain, the physical resource unit numbered n2 by M physical resource units in the first frequency domain region.

11. The method according to claim 10, wherein the first time region and the second time region are in a same slot and do not overlap with each other.

12. The method according to claim 1, wherein for a bandwidth region, at least one of the following is specified: there are N virtual resource units in each first set, or there are N physical resource units in each first frequency domain region, and wherein N is preconfigured by the network device or configured by using higher layer signaling.

13. The method according to claim 4, wherein the method further comprises:
receiving higher layer signaling sent by the network device, wherein the higher layer signaling is used to indicate a frequency domain position, in each bandwidth region, of at least one of the following: the at least one first frequency domain region, or the at least one second frequency domain region in the bandwidth region.

14. A resource allocation apparatus, the apparatus comprising:
at least one processor; and a memory storing instructions executable by the at least one processor, wherein the instructions, when executed by the at least one processor, instruct the at least one processor to:
determine one or more bandwidth regions in system bandwidth that are used by the terminal device, wherein the terminal device receives or sends a data channel in the bandwidth region, wherein the system bandwidth comprises at least one interleaving region, wherein each interleaving region comprises at least one physical resource unit contiguous in frequency domain, wherein each bandwidth region comprises at least one first frequency domain region non-overlapping in frequency domain, wherein each first frequency domain region completely overlaps at least one interleaving region in frequency domain, wherein the at least one first frequency domain region is in a one-to-one correspondence with at least one first set, and wherein each first set comprises at least one virtual resource unit; and receive indication information sent by a network device, wherein the indication information is used to indicate a type of a virtual resource unit in the at least one first set.

15. The apparatus according to claim 14, wherein the type of the virtual resource unit in the first set is a localized virtual resource unit or a distributed virtual resource unit.

16. The apparatus according to claim 14, wherein a quantity of virtual resource units in each first set is equal to a quantity of physical resource units in a first frequency domain region corresponding to the first set, and wherein the virtual resource unit in each first set is mapped to a physical resource unit in the first frequency domain region corresponding to the first set.

17. The apparatus according to claim 14, wherein each bandwidth region further comprises at least one second frequency domain region non-overlapping in frequency domain, wherein each second frequency domain region partially overlaps at least one interleaving region in frequency domain, wherein the at least one second frequency domain region is in a one-to-one correspondence with at least one second set, wherein each second set comprises at least one virtual resource unit, and wherein a type of the virtual resource unit in the second set is a localized virtual resource unit.

18. The apparatus according to claim 17, wherein a quantity of virtual resource units in each second set is equal to a quantity of physical resource units in a second frequency domain region corresponding to the second set, and wherein the virtual resource unit in each second set is mapped to a physical resource unit in a frequency domain overlapping part between an interleaving region and the second frequency domain region corresponding to the second set.

19. The apparatus according to claim 14, wherein the indication information is higher layer signaling and is used to indicate a type of the virtual resource unit in each first set.

20. The apparatus according to claim 14, wherein virtual resource units in all the first sets are of a same type, and wherein the indication information is downlink control signaling and is used to indicate the type of the virtual resource units in all the first sets.

* * * * *